US010866306B2

(12) United States Patent
Maher et al.

(10) Patent No.: US 10,866,306 B2
(45) Date of Patent: Dec. 15, 2020

(54) INCREASING PERFORMANCE OF A RECEIVE PIPELINE OF A RADAR WITH MEMORY OPTIMIZATION

(71) Applicant: UHNDER, INC., Austin, TX (US)

(72) Inventors: Monier Maher, St. Louis, MO (US); Jean Pierre Bordes, St. Charles, MO (US); Curtis Davis, St. Louis, MO (US)

(73) Assignee: UHNDER, INC., Austin, TX (US)

( * ) Notice: Subject to any disclaimer, the term of this patent is extended or adjusted under 35 U.S.C. 154(b) by 398 days.

(21) Appl. No.: 15/893,021

(22) Filed: Feb. 9, 2018

(65) Prior Publication Data

US 2018/0231636 A1 Aug. 16, 2018

Related U.S. Application Data

(60) Provisional application No. 62/457,394, filed on Feb. 10, 2017.

(51) Int. Cl.
*G01S 7/35* (2006.01)
*G01S 13/06* (2006.01)
*G01S 13/931* (2020.01)
*G01S 13/64* (2006.01)
*G01S 7/03* (2006.01)
(Continued)

(52) U.S. Cl.
CPC .............. *G01S 7/352* (2013.01); *G01S 7/032* (2013.01); *G01S 7/354* (2013.01); *G01S 13/06* (2013.01);
(Continued)

(58) Field of Classification Search
CPC .......... G01S 7/352; G01S 7/032; G01S 7/354; G01S 13/06; G01S 13/42
See application file for complete search history.

(56) References Cited

U.S. PATENT DOCUMENTS 1,882,128 A 10/1932 Fearing
3,374,478 A 3/1968 Blau
(Continued)

FOREIGN PATENT DOCUMENTS

EP 0725480 11/2011
EP 2374217 4/2013
(Continued)

OTHER PUBLICATIONS

International Search Report of the International Searching Authority from corresponding Patent Cooperation Treaty (PCT) Application No. PCT/IB18/50819, indicated completed on May 23, 2018.
(Continued)

*Primary Examiner* — Marc Anthony Armand
(74) *Attorney, Agent, or Firm* — Gardner Linn

(57) ABSTRACT

A radar sensing system for a vehicle includes transmitters, receivers, a memory, and a processor. The transmitters transmit radio signals and the receivers receive reflected radio signals. The processor produces samples by correlating reflected radio signals with time-delayed replicas of transmitted radio signals. The processor stores this information as a first radar data cube (RDC), with information related to signals reflected from objects as a function of time (one of the dimensions) at various distances (a second dimension) for various receivers (a third dimension). The first RDC is processed to compute velocity and angle estimates, which are stored in a second RDC and a third RDC, respectively. One or more memory optimizations are used to increase performance. Before storing the second RDC and the third RDC in an internal/external memory, the second and third RDCs are sparsified to only include the outputs in specific regions of interest.

20 Claims, 11 Drawing Sheets

(51) Int. Cl.

| | | |
|---|---|---|
| *G01S 13/87* | (2006.01) | |
| *G01S 13/42* | (2006.01) | |
| *G01S 13/58* | (2006.01) | |
| *G11C 11/409* | (2006.01) | |
| *G01S 7/285* | (2006.01) | |
| *G01S 7/40* | (2006.01) | |
| *G01S 13/32* | (2006.01) | |
| *G01S 13/34* | (2006.01) | |
| *G06F 7/72* | (2006.01) | |

(52) U.S. Cl.
 CPC ............ *G01S 13/42* (2013.01); *G01S 13/584* (2013.01); *G01S 13/64* (2013.01); *G01S 13/87* (2013.01); *G01S 13/931* (2013.01); *G11C 11/409* (2013.01); *G01S 7/285* (2013.01); *G01S 7/4017* (2013.01); *G01S 7/4021* (2013.01); *G01S 13/325* (2013.01); *G01S 13/34* (2013.01); *G01S 13/878* (2013.01); *G01S 2013/93271* (2020.01); *G01S 2013/93272* (2020.01); *G01S 2013/93274* (2020.01); *G06F 7/724* (2013.01)

(56) References Cited

U.S. PATENT DOCUMENTS

| | | | |
|---|---|---|---|
| 3,735,398 A | 5/1973 | Ross | |
| 3,750,169 A | 7/1973 | Strenglein | |
| 3,896,434 A | 7/1975 | Sirven | |
| 4,078,234 A | 3/1978 | Fishbein et al. | |
| 4,176,351 A | 11/1979 | De Vita et al. | |
| 4,566,010 A | 1/1986 | Collins | |
| 4,882,668 A | 11/1989 | Schmid et al. | |
| 4,910,464 A | 3/1990 | Trett et al. | |
| 4,939,685 A | 7/1990 | Feintuch | |
| 5,001,486 A | 3/1991 | Bächtiger | |
| 5,034,906 A | 7/1991 | Chang | |
| 5,087,918 A | 2/1992 | May et al. | |
| 5,151,702 A | 9/1992 | Urkowitz | |
| 5,175,710 A | 12/1992 | Hutson | |
| 5,218,619 A | 6/1993 | Dent | |
| 5,272,663 A | 12/1993 | Jones et al. | |
| 5,280,288 A | 1/1994 | Sherry et al. | |
| 5,302,956 A | 4/1994 | Asbury et al. | |
| 5,341,141 A | 8/1994 | Frazier et al. | |
| 5,345,470 A | 9/1994 | Alexander | |
| 5,379,322 A | 1/1995 | Kosaka et al. | |
| 5,497,162 A | 3/1996 | Kaiser | |
| 5,508,706 A | 4/1996 | Tsou et al. | |
| 5,581,464 A | 12/1996 | Woll et al. | |
| 5,657,021 A | 8/1997 | Ehsani-Nategh et al. | |
| 5,657,023 A | 8/1997 | Lewis et al. | |
| 5,691,724 A | 11/1997 | Aker et al. | |
| 5,712,640 A | 1/1998 | Andou | |
| 5,724,041 A | 3/1998 | Inoue et al. | |
| 5,892,477 A | 4/1999 | Wehling | |
| 5,917,430 A | 6/1999 | Greneker, III et al. | |
| 5,920,285 A | 7/1999 | Benjamin | |
| 5,931,893 A | 8/1999 | Dent et al. | |
| 5,959,571 A | 9/1999 | Aoyagi et al. | |
| 5,970,400 A | 10/1999 | Dwyer | |
| 6,067,314 A | 5/2000 | Azuma | |
| 6,069,581 A | 5/2000 | Bell et al. | |
| 6,121,872 A | 9/2000 | Weishaupt | |
| 6,121,918 A | 9/2000 | Tullsson | |
| 6,151,366 A | 11/2000 | Yip | |
| 6,163,252 A | 12/2000 | Nishiwaki | |
| 6,184,829 B1 | 2/2001 | Stilp | |
| 6,191,726 B1 | 2/2001 | Tullsson | |
| 6,288,672 B1 | 9/2001 | Asano et al. | |
| 6,307,622 B1 | 10/2001 | Lewis | |
| 6,347,264 B2 | 2/2002 | Nicosia et al. | |
| 6,400,308 B1 | 6/2002 | Bell et al. | |
| 6,411,250 B1 | 6/2002 | Oswald et al. | |
| 6,417,796 B1 | 7/2002 | Bowlds | |
| 6,424,289 B2 | 7/2002 | Fukae et al. | |
| 6,583,753 B1 | 6/2003 | Reed | |
| 6,614,387 B1 | 9/2003 | Deadman | |
| 6,624,784 B1 | 9/2003 | Yamaguchi | |
| 6,674,908 B1 | 1/2004 | Aronov | |
| 6,714,956 B1 | 3/2004 | Liu et al. | |
| 6,747,595 B2 | 6/2004 | Hirabe | |
| 6,768,391 B1 | 7/2004 | Dent et al. | |
| 6,865,218 B1 | 3/2005 | Sourour | |
| 6,975,246 B1 | 12/2005 | Trudeau | |
| 7,119,739 B1 | 10/2006 | Struckman | |
| 7,289,058 B2 | 10/2007 | Shima | |
| 7,299,251 B2 | 11/2007 | Skidmore et al. | |
| 7,338,450 B2 | 3/2008 | Kristofferson et al. | |
| 7,395,084 B2 | 7/2008 | Anttila | |
| 7,460,055 B2 | 12/2008 | Nishijima et al. | |
| 7,474,258 B1 | 1/2009 | Arikan et al. | |
| 7,545,310 B2 | 6/2009 | Matsuoka | |
| 7,545,321 B2 | 6/2009 | Kawasaki | |
| 7,564,400 B2 | 7/2009 | Fukuda | |
| 7,567,204 B2 | 7/2009 | Sakamoto | |
| 7,609,198 B2 | 10/2009 | Chang | |
| 7,642,952 B2 | 1/2010 | Fukuda | |
| 7,663,533 B2 | 2/2010 | Toennesen | |
| 7,728,762 B2 | 6/2010 | Sakamoto | |
| 7,791,528 B2 | 9/2010 | Klotzbuecher | |
| 7,847,731 B2 | 12/2010 | Wiesbeck et al. | |
| 7,855,677 B2 | 12/2010 | Negoro et al. | |
| 7,859,450 B2 | 12/2010 | Shirakawa et al. | |
| 8,019,352 B2 | 9/2011 | Rappaport et al. | |
| 8,049,663 B2 | 11/2011 | Frank et al. | |
| 8,059,026 B1 | 11/2011 | Nunez | |
| 8,102,306 B2 | 1/2012 | Smith, Jr. et al. | |
| 8,154,436 B2 | 4/2012 | Szajnowski | |
| 8,330,650 B2 | 12/2012 | Goldman | |
| 8,390,507 B2 | 3/2013 | Wintermantel | |
| 8,471,760 B2 | 6/2013 | Szajnowski | |
| 8,532,159 B2 | 9/2013 | Kagawa et al. | |
| 8,547,988 B2 | 10/2013 | Hadani et al. | |
| 8,686,894 B2 | 4/2014 | Fukuda et al. | |
| 8,694,306 B1 | 4/2014 | Short et al. | |
| 9,121,943 B2 | 9/2015 | Stirlin-Gallacher et al. | |
| 9,239,378 B2 | 1/2016 | Kishigami et al. | |
| 9,239,379 B2 | 1/2016 | Burgio et al. | |
| 9,282,945 B2 | 3/2016 | Smith et al. | |
| 9,335,402 B2 | 5/2016 | Maeno et al. | |
| 9,541,639 B2 | 1/2017 | Searcy et al. | |
| 9,568,600 B2 | 2/2017 | Alland | |
| 9,575,160 B1 | 2/2017 | Davis et al. | |
| 9,599,702 B1 | 3/2017 | Bordes et al. | |
| 9,689,967 B1 | 6/2017 | Stark et al. | |
| 9,720,073 B1 | 8/2017 | Davis et al. | |
| 9,753,121 B1 | 9/2017 | Davis | |
| 9,753,132 B1 | 9/2017 | Bordes et al. | |
| 9,772,397 B1 | 9/2017 | Bordes et al. | |
| 9,791,551 B1 | 10/2017 | Eshraghi et al. | |
| 9,791,564 B1 | 10/2017 | Harris et al. | |
| 9,806,914 B1 | 10/2017 | Bordes et al. | |
| 9,829,567 B1 | 11/2017 | Davis et al. | |
| 9,846,228 B2 | 12/2017 | Davis et al. | |
| 9,869,762 B1 | 1/2018 | Alland et al. | |
| 2001/0002919 A1 | 6/2001 | Sourour et al. | |
| 2002/0004692 A1 | 1/2002 | Nicosia et al. | |
| 2002/0044082 A1 | 4/2002 | Woodington et al. | |
| 2002/0075178 A1 | 6/2002 | Woodington et al. | |
| 2002/0118522 A1 | 8/2002 | Ho et al. | |
| 2002/0130811 A1 | 9/2002 | Voigtaender | |
| 2002/0147534 A1 | 10/2002 | Delcheccolo et al. | |
| 2002/0155811 A1 | 10/2002 | Prismantas | |
| 2003/0001772 A1 | 1/2003 | Woodington et al. | |
| 2003/0011519 A1 | 1/2003 | Breglia et al. | |
| 2003/0058166 A1 | 3/2003 | Hirabe | |
| 2003/0080713 A1 | 5/2003 | Kirmuss | |
| 2003/0102997 A1 | 6/2003 | Levin et al. | |
| 2003/0235244 A1 | 12/2003 | Pessoa et al. | |
| 2004/0012516 A1 | 1/2004 | Schiffmann | |
| 2004/0015529 A1 | 1/2004 | Tanrikulu et al. | |
| 2004/0066323 A1 | 4/2004 | Richter | |

(56) References Cited

U.S. PATENT DOCUMENTS

| | | |
|---|---|---|
| 2004/0138802 A1 | 7/2004 | Kuragaki et al. |
| 2005/0069162 A1 | 3/2005 | Haykin |
| 2005/0156780 A1 | 7/2005 | Bonthron et al. |
| 2005/0201457 A1 | 9/2005 | Allred et al. |
| 2005/0225476 A1 | 10/2005 | Hoetzel et al. |
| 2006/0012511 A1 | 1/2006 | Dooi et al. |
| 2006/0036353 A1 | 2/2006 | Wintermantel |
| 2006/0050707 A1 | 3/2006 | Sterin |
| 2006/0093078 A1 | 5/2006 | Lewis et al. |
| 2006/0109170 A1 | 5/2006 | Voigtlaender et al. |
| 2006/0109931 A1 | 5/2006 | Asai |
| 2006/0114324 A1 | 6/2006 | Farmer et al. |
| 2006/0140249 A1 | 6/2006 | Kohno |
| 2006/0181448 A1 | 8/2006 | Natsume et al. |
| 2006/0244653 A1 | 11/2006 | Szajnowski |
| 2006/0262007 A1 | 11/2006 | Bonthron |
| 2006/0262009 A1 | 11/2006 | Watanabe |
| 2007/0018884 A1 | 1/2007 | Adams |
| 2007/0018886 A1 | 1/2007 | Watanabe et al. |
| 2007/0109175 A1 | 5/2007 | Fukuda |
| 2007/0120731 A1 | 5/2007 | Kelly, Jr. et al. |
| 2007/0132633 A1 | 6/2007 | Uchino |
| 2007/0152870 A1 | 7/2007 | Woodington et al. |
| 2007/0152871 A1 | 7/2007 | Puglia |
| 2007/0152872 A1 | 7/2007 | Woodington |
| 2007/0164896 A1 | 7/2007 | Suzuki et al. |
| 2007/0171122 A1 | 7/2007 | Nakano |
| 2007/0182619 A1 | 8/2007 | Honda et al. |
| 2007/0182623 A1 | 8/2007 | Zeng |
| 2007/0188373 A1 | 8/2007 | Shirakawa et al. |
| 2007/0200747 A1 | 8/2007 | Okai |
| 2007/0279303 A1 | 12/2007 | Schoebel |
| 2008/0208472 A1 | 8/2008 | Morcom |
| 2008/0272955 A1 | 11/2008 | Yonak et al. |
| 2009/0015459 A1 | 1/2009 | Mahler et al. |
| 2009/0015464 A1 | 1/2009 | Fukuda |
| 2009/0051581 A1 | 2/2009 | Hatono |
| 2009/0072957 A1 | 3/2009 | Wu et al. |
| 2009/0073025 A1 | 3/2009 | Inoue et al. |
| 2009/0074031 A1 | 3/2009 | Fukuda |
| 2009/0079617 A1 | 3/2009 | Shirakawa et al. |
| 2009/0085827 A1 | 4/2009 | Orime et al. |
| 2009/0103593 A1 | 4/2009 | Bergamo |
| 2009/0121918 A1 | 5/2009 | Shirai et al. |
| 2009/0212998 A1 | 8/2009 | Szajnowski |
| 2009/0237293 A1 | 9/2009 | Sakuma |
| 2009/0267822 A1 | 10/2009 | Shinoda et al. |
| 2009/0289831 A1 | 11/2009 | Akita |
| 2009/0295623 A1 | 12/2009 | Falk |
| 2010/0019950 A1 | 1/2010 | Yamano et al. |
| 2010/0116365 A1 | 5/2010 | McCarty |
| 2010/0156690 A1 | 6/2010 | Kim et al. |
| 2010/0198513 A1 | 8/2010 | Zeng et al. |
| 2010/0277359 A1 | 11/2010 | Ando |
| 2010/0289692 A1 | 11/2010 | Winkler |
| 2011/0006944 A1 | 1/2011 | Goldman |
| 2011/0032138 A1 | 2/2011 | Krapf |
| 2011/0074620 A1 | 3/2011 | Wintermantel |
| 2011/0187600 A1 | 8/2011 | Landt |
| 2011/0196568 A1 | 8/2011 | Nickolaou |
| 2011/0248796 A1 | 10/2011 | Pozgay |
| 2011/0279303 A1 | 11/2011 | Smith, Jr. et al. |
| 2011/0279307 A1 | 11/2011 | Song |
| 2011/0285576 A1 | 11/2011 | Lynam |
| 2011/0291874 A1 | 12/2011 | De Mersseman |
| 2011/0291875 A1 | 12/2011 | Szajnowski |
| 2011/0292971 A1 | 12/2011 | Hadani et al. |
| 2011/0298653 A1 | 12/2011 | Mizutani |
| 2012/0001791 A1 | 1/2012 | Wintermantel |
| 2012/0050093 A1 | 3/2012 | Heilmann et al. |
| 2012/0105268 A1 | 5/2012 | Smits et al. |
| 2012/0112957 A1 | 5/2012 | Nguyen et al. |
| 2012/0133547 A1 | 5/2012 | MacDonald et al. |
| 2012/0173246 A1 | 7/2012 | Choi et al. |
| 2012/0195349 A1 | 8/2012 | Lakkis |
| 2012/0257643 A1 | 10/2012 | Wu et al. |
| 2012/0319900 A1 | 12/2012 | Johansson et al. |
| 2013/0016761 A1 | 1/2013 | Nentwig |
| 2013/0021196 A1 | 1/2013 | Himmelstoss |
| 2013/0027240 A1 | 1/2013 | Chowdhury |
| 2013/0069818 A1 | 3/2013 | Shirakawa et al. |
| 2013/0102254 A1 | 4/2013 | Cyzs |
| 2013/0113653 A1 | 5/2013 | Kishigami et al. |
| 2013/0135140 A1 | 5/2013 | Kishigami |
| 2013/0169485 A1 | 7/2013 | Lynch |
| 2013/0176154 A1 | 7/2013 | Bonaccio et al. |
| 2013/0214961 A1 | 8/2013 | Lee et al. |
| 2013/0229301 A1 | 9/2013 | Kanamoto |
| 2013/0244710 A1 | 9/2013 | Nguyen et al. |
| 2013/0314271 A1 | 11/2013 | Braswell et al. |
| 2013/0321196 A1 | 12/2013 | Binzer et al. |
| 2014/0022108 A1 | 1/2014 | Alberth, Jr. et al. |
| 2014/0028491 A1 | 1/2014 | Ferguson |
| 2014/0035774 A1 | 2/2014 | Khlifi |
| 2014/0070985 A1 | 3/2014 | Vacanti |
| 2014/0085128 A1 | 3/2014 | Kishigami et al. |
| 2014/0111372 A1 | 4/2014 | Wu |
| 2014/0139322 A1 | 5/2014 | Wang et al. |
| 2014/0159948 A1 | 6/2014 | Ishimori et al. |
| 2014/0220903 A1 | 8/2014 | Schulz et al. |
| 2014/0253345 A1 | 9/2014 | Breed |
| 2014/0285373 A1 | 9/2014 | Kuwahara et al. |
| 2014/0327566 A1 | 11/2014 | Burgio et al. |
| 2014/0348253 A1 | 11/2014 | Mobasher et al. |
| 2015/0002329 A1 | 1/2015 | Murad et al. |
| 2015/0002357 A1 | 1/2015 | Sanford et al. |
| 2015/0035662 A1 | 2/2015 | Bowers et al. |
| 2015/0061922 A1 | 3/2015 | Kishigami |
| 2015/0103745 A1 | 4/2015 | Negus et al. |
| 2015/0198709 A1 | 7/2015 | Inoue |
| 2015/0204966 A1 | 7/2015 | Kishigami |
| 2015/0204971 A1 | 7/2015 | Kuehnle |
| 2015/0226848 A1 | 8/2015 | Park |
| 2015/0234045 A1 | 8/2015 | Rosenblum |
| 2015/0247924 A1 | 9/2015 | Kishigami |
| 2015/0255867 A1 | 9/2015 | Inoue |
| 2015/0301172 A1 | 10/2015 | Ossowska |
| 2015/0323660 A1 | 11/2015 | Hampikian |
| 2015/0331090 A1 | 11/2015 | Jeong et al. |
| 2016/0003939 A1 | 1/2016 | Stainvas Olshansky et al. |
| 2016/0018511 A1 | 1/2016 | Nayyar et al. |
| 2016/0033631 A1 | 2/2016 | Searcy et al. |
| 2016/0033632 A1 | 2/2016 | Searcy et al. |
| 2016/0041260 A1 | 2/2016 | Cao et al. |
| 2016/0061935 A1 | 3/2016 | McCloskey et al. |
| 2016/0084941 A1 | 3/2016 | Arage |
| 2016/0084943 A1 | 3/2016 | Arage |
| 2016/0091595 A1 | 3/2016 | Alcalde |
| 2016/0124086 A1 | 5/2016 | Jansen et al. |
| 2016/0139254 A1* | 5/2016 | Wittenberg ........... G01S 13/584 342/27 |
| 2016/0146931 A1 | 5/2016 | Rao et al. |
| 2016/0154103 A1 | 6/2016 | Moriuchi |
| 2016/0238694 A1 | 8/2016 | Kishigami |
| 2017/0010361 A1 | 1/2017 | Tanaka |
| 2017/0023661 A1 | 1/2017 | Richert |
| 2017/0023663 A1 | 1/2017 | Subburaj et al. |
| 2017/0074980 A1 | 3/2017 | Adib |
| 2017/0153316 A1 | 6/2017 | Wintermantel |
| 2017/0219689 A1 | 8/2017 | Hung et al. |
| 2017/0234968 A1 | 8/2017 | Roger et al. |
| 2017/0293025 A1 | 10/2017 | Davis et al. |
| 2017/0293027 A1 | 10/2017 | Stark et al. |
| 2017/0307728 A1 | 10/2017 | Eshraghi et al. |
| 2017/0309997 A1 | 10/2017 | Alland et al. |
| 2017/0310758 A1 | 10/2017 | Davis et al. |
| 2017/0336495 A1 | 11/2017 | Davis et al. |

FOREIGN PATENT DOCUMENTS

| | | |
|---|---|---|
| EP | 2821808 | 7/2015 |
| FR | 2751086 | 1/1998 |
| WO | WO2015175078 | 11/2015 |
| WO | WO2015185058 | 12/2015 |

(56) References Cited

FOREIGN PATENT DOCUMENTS

| WO | WO2016011407 | 1/2016 |
| WO | WO2016030656 | 3/2016 |
| WO | WO2017187330 | 11/2017 |

OTHER PUBLICATIONS

Written Opinion of the International Searching Authority from corresponding Patent Cooperation Treaty (PCT) Application No. PCT/IB18/50819, indicated completed on May 23, 2018.

Chambers et al., "An article entitled Real-Time Vehicle Mounted Multistatic Ground Penetrating Radar Imaging System for Buried Object Detection," Lawrence Livermore National Laboratory Reports (LLNL-TR-615452), Feb. 4, 2013; Retrieved from the Internet from https://e-reports-ext.llnl.gov/pdf/711892.pdf.

Fraser, "Design and simulation of a coded sequence ground penetrating radar," In: Diss. University of British Columbia, Dec. 3, 2015.

Zhou et al., "Linear extractors for extracting randomness from noisy sources," In: Information Theory Proceedings (ISIT), 2011 IEEE International Symposium on Oct. 3, 2011.

V. Giannini et al., "A 79 GHz Phase-Modulated 4 GHz-BW CW Radar Transmitter in 28 nm CMOS," in IEEE Journal of Solid-State Circuits, vol. 49, No. 12, pp. 2925-2937, Dec. 2014. (Year: 2014).

\* cited by examiner

INCREASING PERFORMANCE OF A RECEIVE PIPELINE OF A RADAR WITH MEMORY OPTIMIZATION

CROSS REFERENCE TO RELATED APPLICATIONS

The present application claims the filing benefits of U.S. provisional application, Ser. No. 62/457,394, filed Feb. 10, 2017, which is hereby incorporated by reference herein in its entirety.

FIELD OF THE INVENTION

The present invention is directed to radar systems, and in particular to radar systems for vehicles.

BACKGROUND OF THE INVENTION

The use of radar to determine range, velocity, and angle (elevation or azimuth) of objects in an environment is important in a number of applications including automotive radar and gesture detection. Radar typically transmits a radio frequency (RF) signal and listens for the reflection of the radio signal from objects in the environment. A radar system estimates the location of objects, also called targets, in the environment by correlating delayed versions of the received radio signal with the transmitted radio signal. A radar system can also estimate the velocity of the target by Doppler processing. A radar system with multiple transmitters and multiple receivers can also determine the angular position of a target.

A radar system consists of transmitters and receivers. The transmitters generate a baseband signal which is up-converted to a radio frequency (RF) signal that propagates according to an antenna pattern. The transmitted signal is reflected off of objects or targets in the environment. The received signal at each receiver is the totality of the reflected signal from all targets in the environment. The receiver down-converts the received signal to a baseband signal and compares the baseband received signal to the baseband signal at one or more transmitters. This is used to determine the range, velocity, and angle of targets in the environment. The resultant data sets produced by the range estimation, Doppler/velocity estimation, and angle estimation are stored in so-called radar data cubes (RDCs) that store complex samples corresponding to different values of range, Doppler/velocity, and angle to complex vectors. Conceptually, the data is stored in a cube with the axes corresponding to range, Doppler/velocity, and angle. The information stored in a radar data cube is stored in a memory for subsequent processing. This may require a very large amount of memory for high resolution radar systems. This may also take a long time to transfer externally to an integrated circuit (off-chip memory). The storage of large blocks of data in memory (such as the storage of RDCs) is also prone to errors. Methods and mechanisms are needed to detect and correct errors.

SUMMARY OF THE INVENTION

Embodiments of the present invention provide methods and an apparatus to improve the performance of a radar system. An exemplary radar system is configured to optimize a memory storage and to access of radar data cubes (RDCs) generated by Doppler and angle processing in the radar system. Depending on the throughput of the radar system (the number of newly generated RDCs per second), and the number of bins (the quantization level) used to specify range, velocity, and angle of the targets in the environment, storing the RDCs can have a large memory requirement. Embodiments of the present invention provide methods and techniques for categorizing regions of the RDCs and/or thresholding values to sparsify RDCs, optimizing DRAM access patterns in reads and writes to the first RDC, transforming samples with on-the-fly block floating point in the first RDC to reduce bit-width, pipelining the execution to maximize concurrency across different compute modules, adding error detecting or error correcting bits to samples for functional verification, and storing the sparsified versions of the RDCs to memory at specific locations for subsequent processing.

A radar sensing system for a vehicle in accordance with an embodiment of the present invention includes a transmit pipeline, a receive pipeline, a sparsifier processor, and a memory. The transmit pipeline includes a plurality of transmitters configured for installation and use on a vehicle and configured to transmit radio signals. The receive pipeline includes a plurality of receivers configured for installation and use on the vehicle and configured to receive radio signals that include the transmitted radio signals transmitted by the transmitters and reflected from objects in an environment. The receive pipeline is configured to correlate the received radio signals of the plurality of receivers with a plurality of time-delayed replicas of the transmitted radio signals to produce samples arranged in a first three-dimensional array (RDC) representing ranges of different objects in the environment as measured by different receivers. The receive pipeline is configured to process the first RDC to estimate a Doppler for given ranges and given receivers to produce a second RDC. The receive pipeline is configured to process the second RDC to estimate angles of targets in the environment for given ranges and Doppler to produce a third RDC. The receive pipeline is configured to output the second RDC and the third RDC to the sparsifier processor. The sparsifier processor is configured to analyze the second RDC and the third RDC to compute sparse versions of the second RDC and the third RDC. The sparse versions of the second RDC and the third RDC are stored in the memory for further processing.

A method for optimizing memory performance and access of a three-dimensional array (RDC) in a receive pipeline of a radar system for a vehicle in accordance with an embodiment of the present invention includes transmitting, with a plurality of transmitters, radio signals. A plurality of receivers receive radio signals that include the transmitted radio signals transmitted by the transmitters and reflected from objects in an environment. The received radio signals of the plurality of receivers are correlated with a plurality of time-delayed replicas of the transmitted radio signals to produce samples arranged in a first RDC representing ranges of different objects in the environment as measured by different receivers. The first RDC is processed to estimate a Doppler at a given range and for a given receiver to produce a second RDC. The first RDC is output from a correlation processor to a dynamic random access memory (DRAM) arranged by receivers in an inner loop, followed by range-bin and time. The first RDC is input from the DRAM to a Doppler processor by means of prefetching to a local buffer. The method further includes maximizing DRAM read performance by burst locality by preserving access to data from multiple receivers.

A method for optimizing memory performance and access of a three-dimensional array (RDC) in a receive pipeline of a radar system for a vehicle in accordance with an embodiment of the present invention includes transmitting, with a plurality of transmitters, radio signals. A plurality of receivers receive radio signals that include the transmitted radio signals transmitted by the transmitters and reflected from objects in an environment. The received radio signals of the plurality of receivers are correlated with a plurality of time-delayed replicas of the transmitted radio signals to produce samples arranged in a first RDC representing ranges of different objects in the environment as measured by different receivers. The first RDC is processed to estimate Doppler at a given range and for a given receiver to produce a second RDC. The method further includes computing one or more common block exponents for the first RDC to reduce a bit-width required to represent complex numbers in samples of the first RDC.

In an aspect of the present invention, an exemplary sparsifier processor estimates voxels (three-dimension data) in a radar data cube that corresponds to a range of low absolute velocity, and thereby tags voxels as belonging to a static image, which are to be stored for subsequent processing. For all remaining voxels, the sparsifier processor then performs a threshold comparison against the noise floors estimated for each range bin across all Doppler values and angles. The sparsifier processor may use a pipelined architecture to read radar data cubes from buffers as they are being computed, apply a sparsification process, and output sparse versions of the radar data cubes to a memory for subsequent processing.

These and other objects, advantages, purposes and features of the present invention will become apparent upon review of the following specification in conjunction with the drawings.

DESCRIPTION OF THE PREFERRED EMBODIMENTS

Figure 1:
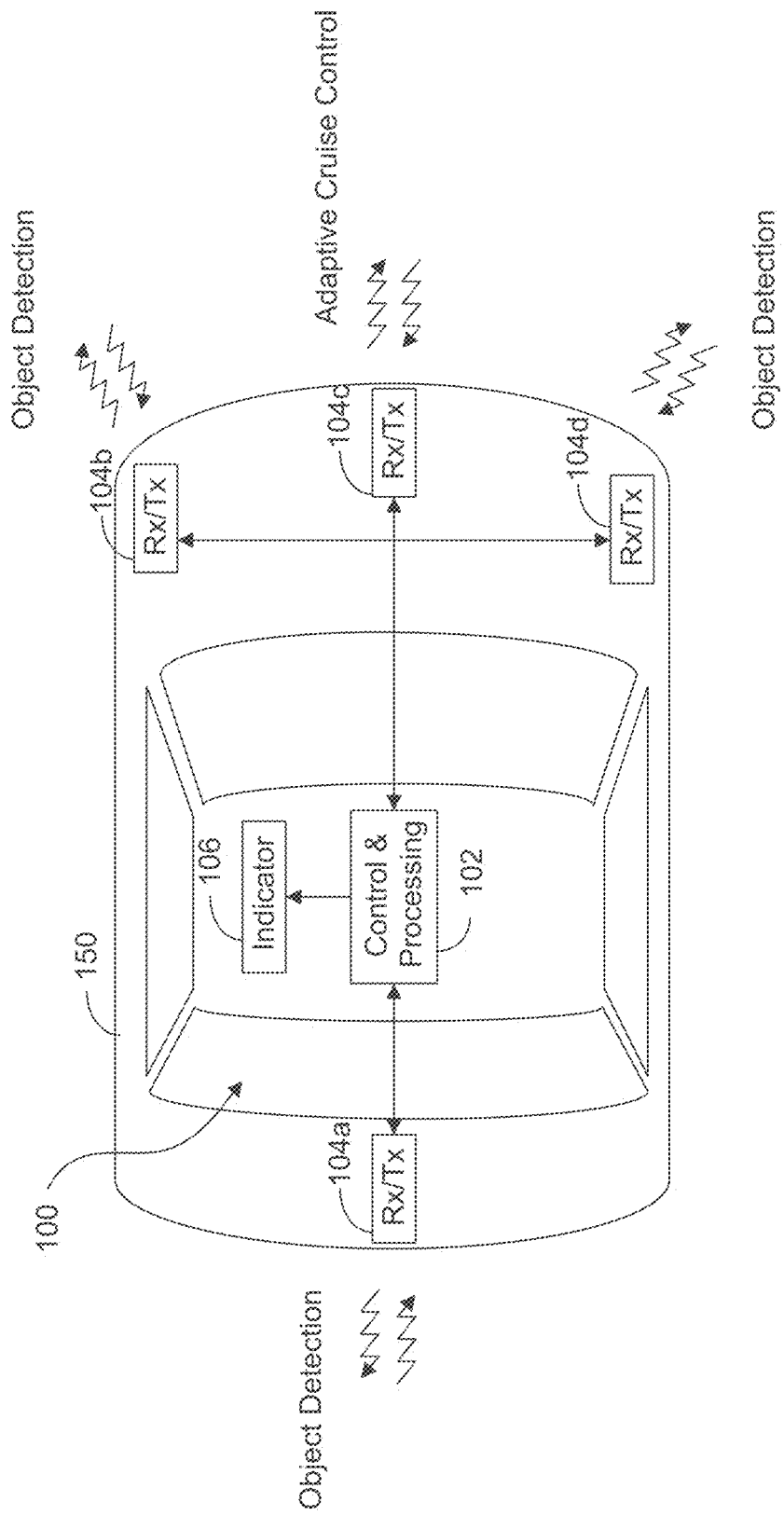
FIG. 1 is a plan view of an automobile equipped with a radar system in accordance with the present invention.

The present invention will now be described with reference to the accompanying figures, wherein numbered elements in the following written description correspond to like-numbered elements in the figures. Methods and systems of the present invention may achieve higher throughput of an exemplary radar system and have reduced memory requirements. Radar data cubes store complex numbers generated by processing the correlation between delayed versions of the transmitted signals with received signals. As discussed herein, the radar data cubes, which may be quite large, may be sparsified before storing to an external (e.g., off-chip) memory. The exemplary sparsification is achieved through one or more methods that include identification of regions in the computed radar data cubes of low absolute velocity and thresholding of remaining regions based on software thresholds or thresholds of noise floors estimated with power histograms. Exemplary embodiments may also achieve high throughput by employing a pipelined architecture for the sparsification step.

A target at a given range and angle, and with a given velocity, will produce a complex number which may be stored in memory at an associated location in the RDC. While the information is described as stored in a radar data cube, the information contained in the radar cube may be stored in a variety of manners including storing the information in a linear fashion. That is, storing the information for a first time and a first virtual receiver for all ranges in an array of memory elements, followed by the information for the second time and first virtual receiver and so on. These RDCs need to be stored to memory for subsequent processing. Information stored in an RDC is related to the strength of the signal (the magnitude of the complex number) corresponding to a particular range, Doppler, or virtual receiver. The magnitude of these numbers generally will exhibit locality, meaning large values will be concentrated around a small set of values of range, Doppler, or virtual receiver. For real-time radar systems, such as automotive radar systems, memory considerations may prevent the storage of entire RDCs. Thus, RDCs need to be sparsified, i.e. compressed to retain only the values corresponding to certain regions of interest without sacrificing accuracy of subsequent processing or retrieval.

Write operations to a "first RDC" will store samples in the first RDC in a particular order. Read operations from the first RDC will access samples in the first RDC in a different order. Write operations to the first RDC will exhibit locality in virtual receivers. Write operations first take place (inner loop) with respect to an index corresponding to the virtual receiver. That is, the first memory location to be written in will correspond to the first virtual receiver for the first range bin. The second memory location to be written in will be the second virtual receiver for the first range bin. Once data for all memory locations for the first range bin have been written in, data corresponding to the second range bin will be written to memory. Meanwhile, read operations from the first RDC for Doppler/velocity processing expect locality in the time axis. This mismatch can greatly reduce the performance of memory access by not utilizing locality. Thus, specific memory access patterns and prefetching to intermediate buffers need to be enabled to maximize memory throughput.

The computed samples in the first RDC, as well as in a "second RDC," are complex numbers. Computing and storing floating point numbers requires the storage of exponents, which reduces accuracy in exchange for a larger range of values with a fixed number of bits. Meanwhile, fixed-point notation will limit dynamic range but will have better accuracy. As a trade-off, block floating-point notation may be used, which stores common exponents for a block of data, along with the bit-width optimized for range and accuracy. However, the common exponent per block needs to be computed on-the-fly and appropriately stored during writes and correctly decoded during reads.

There are several compute modules in a receive pipeline of a radar system that need to run concurrently for high performance. If the modules are run concurrently, the modules may consequently read and write smaller blocks of the radar cubes to intermediate buffer storage and thereby avoid large memory requirements. Thus, as described herein, to optimize the performance of an exemplary radar system, a pipelined architecture with different compute modules interfaced with appropriately sized buffers is needed.

However, as discussed herein, the storage of large blocks of data in memory is prone to errors. Especially, for automotive radars, where the system must be able to self-diagnose any errors and preferably correct them. Therefore, mechanisms are needed that will append suitable parity and check bits to detect and correct errors, before subsequent processing.

FIG. 1 Illustrates an exemplary radar system 100 configured for use in a vehicle 150. In an aspect of the present invention, a vehicle 150 may be an automobile, truck, or bus, etc. The radar system 100 may utilize multiple radar systems (e.g., 104a-104d) embedded in the vehicle 150 (see FIG. 1). Each of these radar systems may employ multiple transmitters, receivers, and antennas (see FIG. 3). These signals are reflected from objects (also known as targets) in the environment and received by one or more receivers of the radar system. A transmitter-receiver pair is called a virtual radar (or sometimes a virtual receiver). As illustrated in FIG. 1, the radar system 100 may comprise one or more transmitters and one or more receivers (104a-104d) for a plurality of virtual radars. Other configurations are also possible. FIG. 1 illustrates the receivers/transmitters 104a-104d placed to acquire and provide data for object detection and adaptive cruise control. As illustrated in FIG. 1, a controller 102 receives and the analyzes position information received from the receivers 104a-104d and forwards processed information (e.g., position information) to, for example, an indicator 106 or other similar devices, as well as to other automotive systems. The radar system 100 (providing such object detection and adaptive cruise control or the like) may be part of an Advanced Driver Assistance System (ADAS) for the automobile 150.

An exemplary radar system operates by transmitting one or more signals from one or more transmitters and then listening for reflections of those signals from objects in the environment by one or more receivers. By comparing the transmitted signals and the received signals, estimates of the range, velocity, and angle (azimuth and/or elevation) of the objects can be estimated.

There are several different types of signals that transmitters in radar systems employ. A radar system may transmit a continuous signal or a pulsed signal. In a pulsed radar system, the signal is transmitted for a short time and then no signal is transmitted. This is repeated over and over. When the signal is not being transmitted, the receiver listens for echoes or reflections from objects in the environment. Often, a single antenna is used for both the transmitter and receiver and the radar transmits on the antenna and then listens to the received signal on the same antenna. This process is then repeated. In a continuous wave radar system, the signal is continuously transmitted. There may be an antenna for transmitting and a separate antenna for receiving. One type of continuous wave radar signal is known as a frequency modulated continuous wave (FMCW) radar signal. In FMCW, the transmitted signal is a sinusoidal signal with a varying frequency. By measuring a time difference between when a certain frequency was transmitted and when the received signal contained that frequency, the range to an object can be determined.

A second type of continuous wave signal used in radar systems is a phase modulated continuous wave (PMCW) signal. In this type of radar system, the transmitted signal is a sinusoidal signal in which the phase of the sinusoidal signal varies. Typically, the phase during a given time period (called a chip period or chip duration) is one of a finite number of possible phases. A spreading code consisting of a sequence of chips, (e.g., +1, +1, −1, +1, −1 . . . ) is mapped (e.g., +1→0, −1→π) into a sequence of phases (e.g., 0, 0, π, 0, π . . . ) that is used to modulate a carrier to generate the radio frequency (RF) signal. The spreading code could be a periodic sequence or could be a pseudo-random sequence with a very large period so it appears to be a nearly random sequence. The spreading code could be a binary code (e.g., +1 or −1). The resulting signal has a bandwidth that is proportional to the rate at which the phases change, called the chip rate $R_C$, which is the inverse of the chip duration $T_C=1/R_C$. By comparing the return signal to the transmitted signal, the receiver can determine the range and the velocity of reflected objects.

Figure 2A:
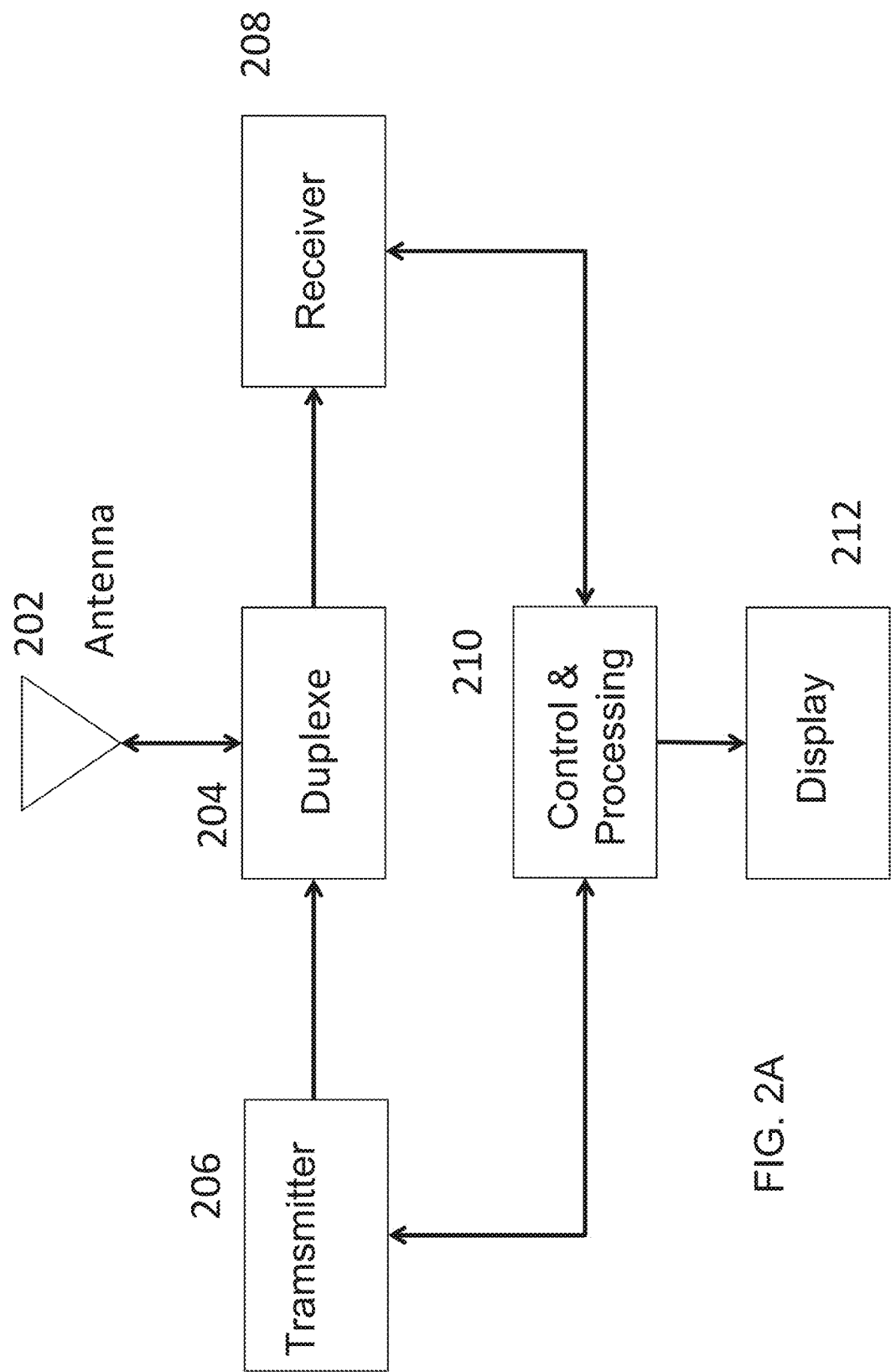
FIG. 2A and FIG. 2B are block diagrams of radar systems in accordance with the present invention.
Figure 2B:
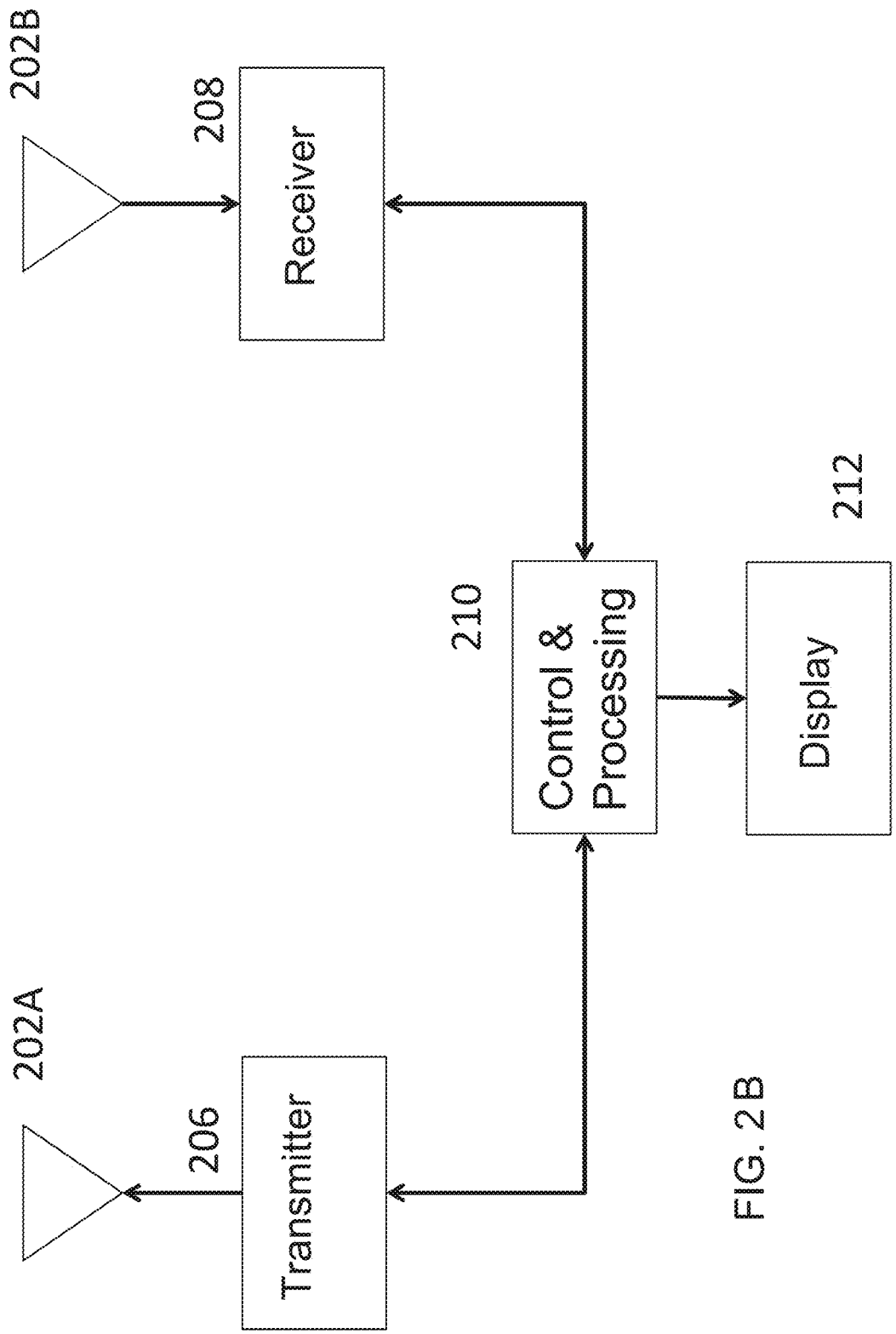

There are several ways to implement a radar system. One way, illustrated in FIG. 2A, uses a single antenna 202 for both transmitting and receiving radio signals. The antenna 202 is connected to a duplexer 204 that routes the appropriate signal from the antenna 202 to the receiver 208 or routes the signal from the transmitter 206 to the antenna 202. A control processor 210 controls the operation of the transmitter 206 and receiver 208 and estimates the range and velocity of objects in the environment. A second way to implement a radar system is illustrated in FIG. 2B. In this system, there are separate antennas for transmitting (202A) and receiving (202B). A control processor 210 performs the same basic functions as in FIG. 2A. In each case, there may be a display 212 to visualize the location of objects in the environment.

Figure 3:
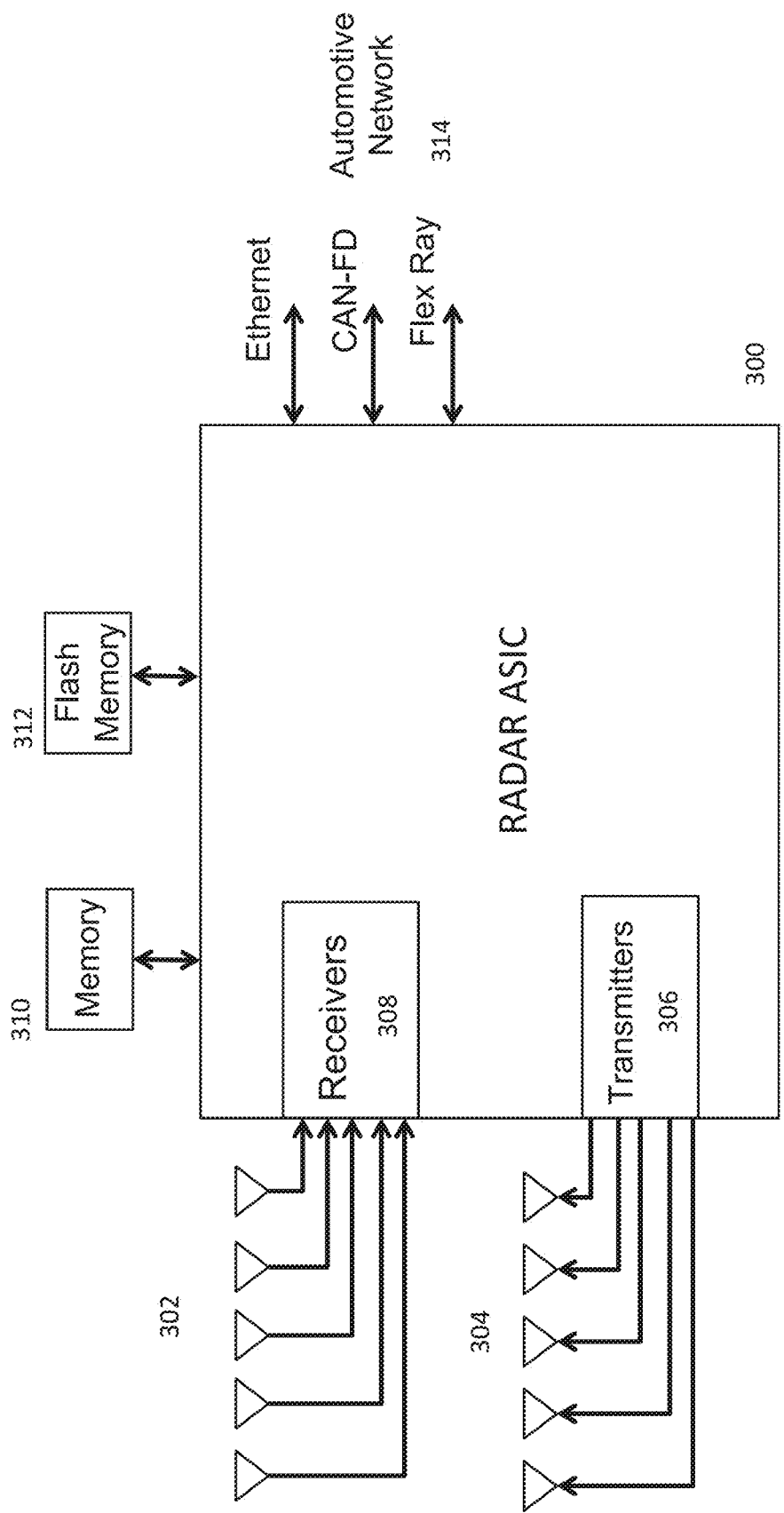
FIG. 3 is a block diagram illustrating a radar system with a plurality of receivers and a plurality of transmitters in accordance with the present invention.

A radar system with multiple antennas, transmitters and receivers is illustrated in FIG. 3. Using multiple antennas 302, 304 allows an exemplary radar system 300 to determine the angle (azimuth or elevation or both) of targets in the environment. Depending on the geometry of the antenna system, different angles (e.g., azimuth or elevation) can be determined.

The radar system 300 may be connected to a network via an Ethernet connection or other types of network connections 314, such as, for example, CAN-FD and FlexRay. The radar system will have memory (310, 312) to store software and data used for processing the radio signals in order to determine range, velocity, and location of objects. Memory 310, 312 may also be used to store information about targets in the environment. There may also be processing capability contained in the ASIC 208 apart from the transmitters 203 and receivers 204.

The description herein includes an exemplary radar system in which there are $N_T$ transmitters and $N_R$ receivers for $N_T \times N_R$ virtual radars, one for each transmitter-receiver pair. For example, a radar system with eight transmitters and eight receivers will have 64 pairs or 64 virtual radars (with 64 virtual receivers). When three transmitters (Tx1, Tx2, Tx3) generate signals that are being received by four receivers (Rx1, Rx2, Rx3, Rx4), each of the receivers is receiving the transmission from each of the transmitters reflected by objects in the environment. Each receiver can attempt to determine the range and Doppler shift (velocity) of objects by correlating with delayed replicas of the signal from each of the transmitters. Each physical receiver may then be "divided" into three separate virtual receivers, each virtual receiver correlating with delay replicas of one of the transmitted signals to yield a total of 4×3=12 virtual receivers.

The receivers of the radar system may be considered part of a receive pipeline that outputs complex valued digitized samples (i.e., values comprising a mathematical real component and a mathematical imaginary component) to a processor. The complex valued digitized samples may be produced based on correlations between the reflected signals and time-delayed replicas of the transmitted signals. Such correlation values may be determined through the use of a matched filter, although this is not the only way to produce these correlation values. These resulting samples are arranged in two-dimensional arrays known as time slices. The samples are placed into respective range bins of the two-dimensional array (as used herein, a range bin refers to a distance range corresponding to a particular time delay corresponding to the round-trip time of the radar signal from a transmitter, to the target/object, and back to the receiver). The different virtual receivers of the radar system define an x-axis of the two-dimensional time slice and the range bins define a y-axis of the two-dimensional time slice. A new time slice comprising complex valued samples may be generated every 2-30 microseconds; that is, every time a new correlation is produced for a given range bin. Over a longer time interval, herein referred to as a "scan" (typically, in a duration of 1-60 milliseconds or longer), multiple time slices are accumulated to form a three-dimensional radar data cube. An x-axis of the three-dimensional radar data cube is defined by time (with each respective time slice requiring 2-30 microseconds), while the receivers (or virtual receivers) define a z-axis of the three-dimensional radar data cube, and the range bins and their corresponding time delays (ranges) define a y-axis of the three-dimensional radar data cube 1 (RDC1). A radar data cube may have a preselected or a dynamically defined quantity of time slices. For example, a RDC may include 200 time slices or more preferably 3000 time slices or more.

The radar sensing system of the present invention may utilize aspects of the radar systems described in U.S. Pat. Nos. 9,846,228; 9,806,914; 9,791,564; 9,791,551; 9,772,397; 9,753,121; 9,599,702; 9,575,160 and/or 9,689,967, and/or U.S. Publication Nos. US-2017-0309997; US-2017-0307728 and/or US-2017-0310758, and/or U.S. patent application Ser. No. 15/496,038, filed Apr. 25, 2017, Ser. No. 15/689,273, filed Aug. 29, 2017, and/or Ser. No. 15/705,627, filed Sep. 15, 2017, and/or U.S. provisional applications, Ser. No. 62/486,732, filed Apr. 18, 2017, Ser. No. 62/528,789, filed Jul. 5, 2017, Ser. No. 62/573,880, filed Oct. 18, 2017, Ser. No. 62/598,563, filed Dec. 14, 2017, and/or Ser. No. 62/623,092, filed Jan. 29, 2018, which are all hereby incorporated by reference herein in their entireties.

Figure 4:
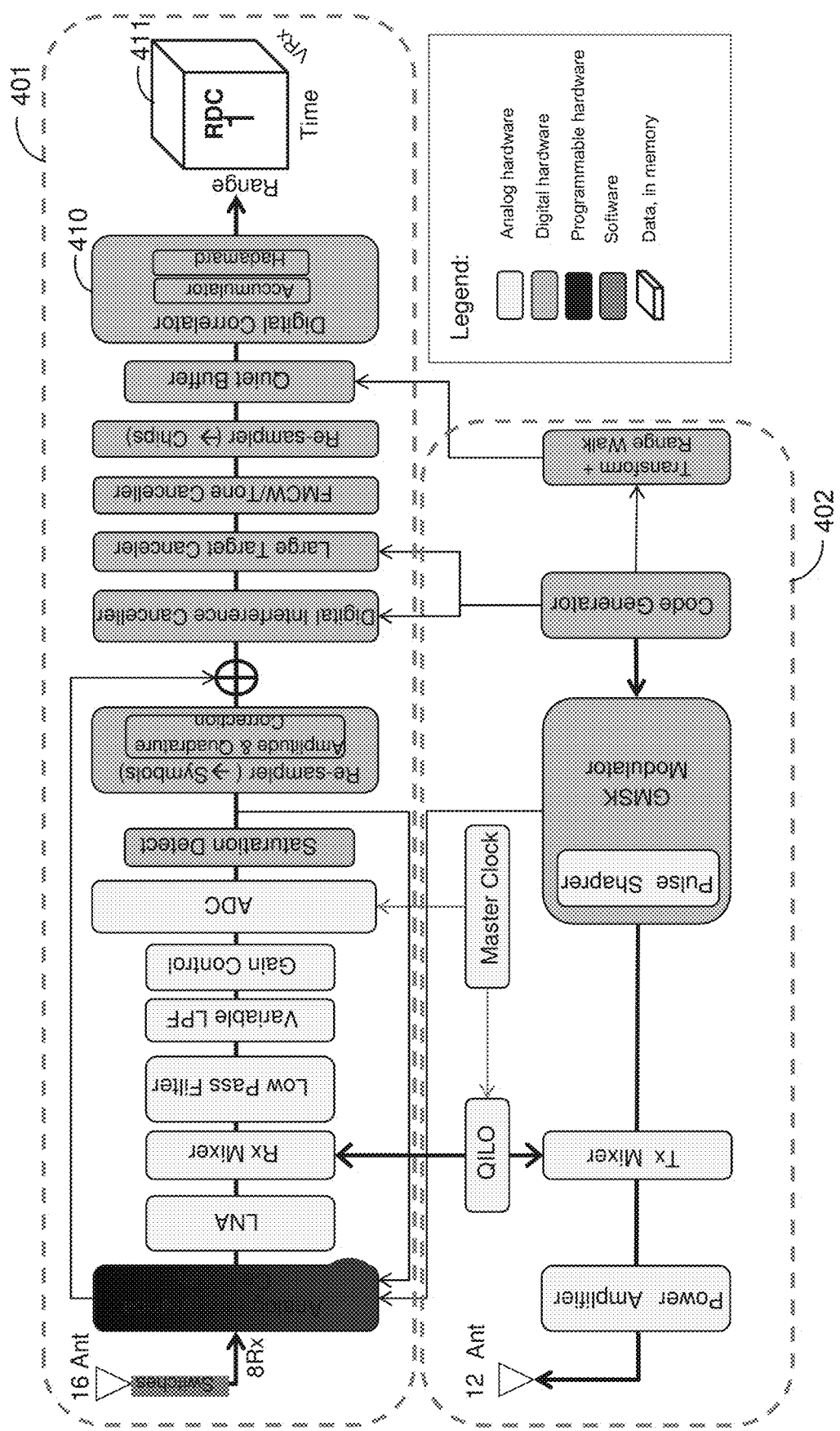
FIG. 4 is a block diagram of an exemplary receive pipeline and transmit pipeline for a radar system in accordance with the present invention.

As illustrated in FIG. 4, and discussed herein, an exemplary correlator processor 410 (also known as a correlation engine) of a receive pipeline 401 generates a sequence of correlator outputs for each possible virtual receiver. A radar system has preferably 4 virtual receivers, or more preferably 32 virtual receivers, or most preferably 256 or more virtual receivers. The larger the number of virtual receivers, the greater is the angular resolution of the radar system. For each virtual receiver, a complex correlator output is provided for each delay, also called a range bin. An exemplary radar system supports preferably 100 range bins, or more preferably 200 range bins, and most preferably 500 or more range bins. The larger the number of range bins, the larger is the resolution of the range detection of the radar system. The correlator output for each virtual receiver and range bin is repeated for multiple time slices which form the scan. The number of time slices can vary from 100 to a more preferably 3000 per scan. The larger the number of time slices, the greater is the Doppler resolution to estimate velocity of targets in the environment. For example, a single scan may preferably have correlator data from 256 virtual receivers for 512 range bins and for over 1024 time slices. As each exemplary complex number requires 4 bytes of storage, the total storage requirement for a radar data cube 1 (RDC1) for a single scan is 512 MB. Storing such large amounts of data is not practical with current storage limits integrated into the chip. On the other hand, storing this off chip would require a significant amount of time to transfer the data. For example, with a rate of 1600 MB/s only about 3 transfers could happen per second. The number of virtual receivers determines the possible angle resolution. More receivers can provide more angular resolution at the expense of additional storage or at the expense of worse range or velocity resolution. Thus, the storage and throughput restrictions limit either the angular resolution, the range resolution, or the velocity resolution.

As illustrated in FIG. 4, and discussed herein, the correlator processor 410 computes the radar data cube RDC1 411, which estimates the range of objects/targets in the environment. RDC1 (411) is further processed by digital back-end processing to compute estimates of velocity and angle (azimuth and/or elevation).

A radar system can determine the velocity of an object by measuring the frequency offset between the transmitted signal and the received signal. The signal reflecting from a moving object will have a frequency shift relative to the transmitted signal. This is called the Doppler Effect and the frequency shift is called the Doppler shift. The Doppler shift is directly related to the radial velocity of the object relative to the radar system. A particular Doppler shift or frequency value may be referred herein as a Doppler value or just as a "Doppler." Doppler is most noticeable with regards to trains passing through a road crossing where the frequency of the sound will go down once the train has passed the road crossing. The signal reflected off an object moving toward the radar sensor will have a higher frequency than the transmitted signal, and an object moving away from the radar sensor will have a lower frequency. If the radar sensor is also moving, then it is the relative velocity between the radar sensor and the object that will determine the amount of frequency shift. Thus, measuring the frequency shift will determine the relative velocity of an object in the environment. The time duration of the transmitted signal will determine the accuracy or resolution of the Doppler value.

Figure 5:
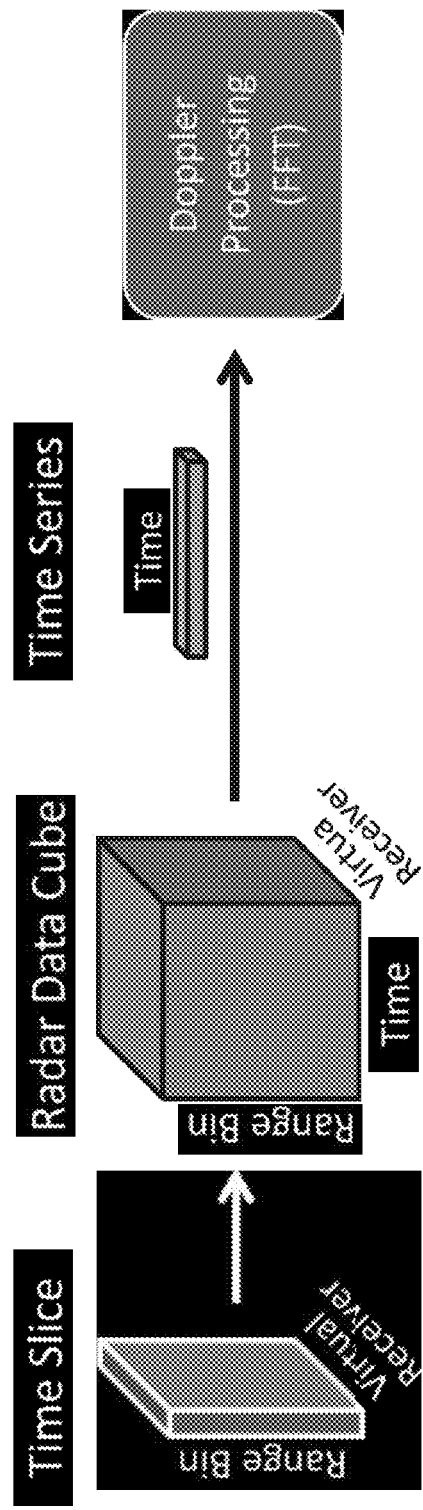
FIG. 5 is a block diagram illustrating the flow of information in the Doppler processing for a radar system in accordance with the present invention.

A "slice" of a cube refers to a two-dimensional subset of the data where one of the variables (either range, time, or receiver) is fixed. A "skewer" of a cube refers to a one-dimensional subset of the data where two of the variables are fixed. To estimate the velocity of an object, a particular "skewer" of the radar data cube RDC1 is processed as shown in FIG. 5. A skewer of the RDC1, where range is fixed, and the virtual receiver is fixed, but the sequence of correlation values for different times are varied, may be used to estimate the Doppler shift. This is the time series illustrated in FIG. 5. By taking a fast Fourier transform (FFT) of a skewer (time series) of RDC1, with respect to the time dimension, the Doppler at a given range, and for a given virtual receiver, can be determined. This information is stored in radar data cube 2 (RDC2).

Figure 6:
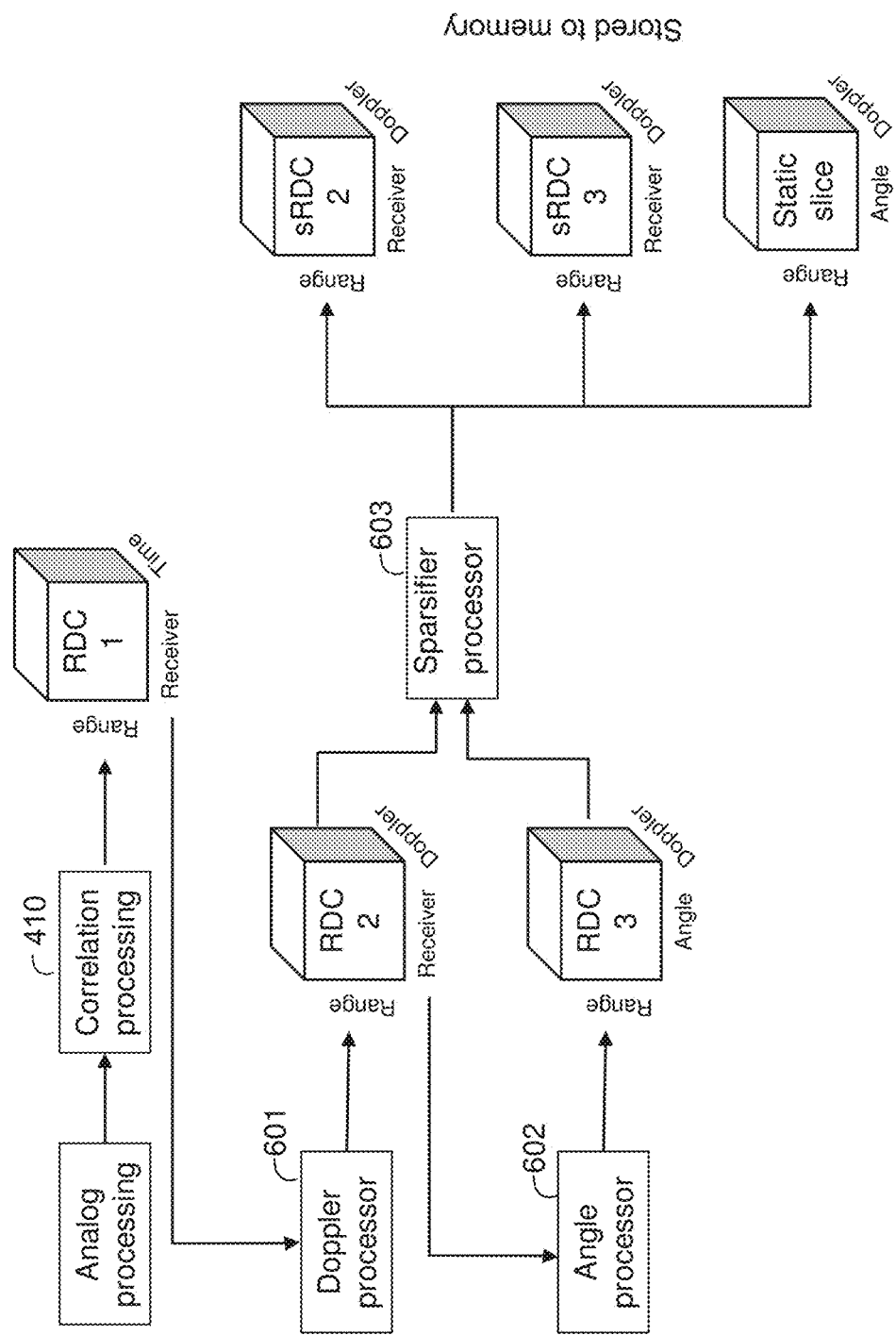
FIG. 6 is a block diagram illustrating the flow of information through the receive pipeline of a radar system, and in particular, through a sparsifier processor of the radar system in accordance with the present invention.

As illustrated in FIG. 6, Doppler processing is performed in the Doppler processor 601. The Doppler processor 601 receives time samples and performs a Fourier transform processing to generate the Doppler information (velocity), which is stored in radar data cube RDC2 for each range bin and virtual receiver. The exemplary Fourier transform can be an FFT, a DFT, or optionally, performed using a channelizer. The time samples can be windowed as needed or zero padded, depending on the radar system objective and/or external inputs. One type of windowing is a rectangular window, which allows for accurately estimating the peak of strong signals at the expense of poorer sidelobe suppression. Using a Dolph-Chebyshev window supports greater sidelobe suppression to allow detection of weaker signals that would otherwise be hidden by the sidelobes of the stronger signals. The signal samples can also be padded to obtain better Doppler sampling granularity. The window used and the padding employed are fully controllable from the control processor. Radar data cube 2 (RDC2) stores complex samples corresponding to three dimensions: range, Doppler, and virtual receiver.

The Doppler resolution of a radar system is dependent on the number of time slices in a scan: the longer the scan the greater the Doppler resolution. For example, a scan of 500 time slices may provide for a maximum Doppler/velocity resolution of 2.0 m/s, while a scan of 2,000 time slices may provide for a maximum Doppler/velocity resolution of 0.5 m/s, a 4× increase. However, longer scans, while requiring larger memory, may also result in longer latency between successive radar images or objects. Nevertheless, a Doppler resolution of 0.5 m/s or lower is preferable. The information stored in radar cube 2 (RDC2) will then contain Doppler estimates for each range bin and virtual receiver. For example, a single scan stored in the RDC2 may preferable contain data from 256 virtual receivers for 512 range bins and for over 2000 Doppler values with resolution 0.5 m/s. This requires storage of about 260 million complex numbers, each requiring 4 bytes of storage, which is about 1,000 MB of storage, for the RDC2 for the single scan. As in the case of the RDC1, on-chip memory limitations and the communications limitation of off-chip bandwidth, make it impractical to store or transmit the entire RDC2 for each scan.

A radar system can estimate the angle of targets in the environment by beamforming in different directions (azimuthal and/or elevation), i.e., by using steering vectors to weight the different receiver outputs. This computation is performed in exemplary angle processor 602, illustrated in FIG. 6. The angle processor 602 takes as an input the RDC2 (computed from the Doppler processing) to estimate the angles for each range bin and each Doppler value. First, an output of an FFT operation in the Doppler processor 601, stored in RDC2, is passed through a spatial windowing function. Then, a beamforming algorithm, such as delay and sum, using steering vectors to weight the different receiver, is used to compute the angle information. The resultant output of the angle processor 602 are complex numbers representing angle estimates for each range bin and Doppler value. This is stored in a radar data cube 3 (RDC3) which has dimensions of range, Doppler, and angle.

Histogram Computation for Noise Floor Estimation:

Using a large number of receivers in an exemplary radar system, with corresponding antennas arranged in an array, provides higher angular accuracy and resolution, such as for the detection of vulnerable road users (VRU) in an automotive radar application. Like in the case of radar data cubes RDC1 and RDC2, higher resolution of the angle processor 602 can result in the size of the radar data cube RDC3 being impractical to store on-chip or to be transferred off-chip. For example, for 64 resolved angles, the size of a single scan of RDC3 will involve preferably 512 range bins, 200 Doppler bins, and 64 angle bins, each with a complex number taking up 4 bytes, totally a memory requirement of more than 25 MB per scan. This is impractical both for on-chip storage and off-chip communication.

Thus, an exemplary radar system should preferably choose only a small set of regions of interest (RoI) in the three radar data cubes which are to be stored in memory or sent off-chip and used for subsequent processing. Preferably, the samples within these regions have similar Doppler, range and/or angle (azimuth and/or elevation). In a preferred embodiment, these regions of interest could correspond to a subset of low absolute velocity, such as due to ground clutter. Alternatively, these regions could correspond to regions with signal power larger than certain thresholds, wherein these thresholds can be either specified in software or computed from estimating noise floors in previous time slices or controlled in an adaptive manner. In a preferred embodiment, these sparsification operations are done by an exemplary sparsifier processor 603 (part of the receive pipeline), illustrated in FIG. 6.

In one embodiment, the output of the angle processor 602, which is stored in RDC3, is analyzed to compute a histogram of the magnitudes of the complex samples stored to estimate noise floors and subsequently threshold regions of interest in the radar data cubes. This computation is performed in an exemplary histogram engine 710, which is part of the sparsifier processor 603, illustrated in FIGS. 6 and 7. This unit (710) has as inputs the slices of RDC3 corresponding to a fixed range bin. A histogram can be computed for each range bin, or optionally for a group of range bins as specified by a parameter that is an input to the histogram engine 710. The histogram is computed over all Doppler velocities and angles. All angle bins computed by the angle processor 602 in RDC3 are collected by the histogram engine 710. In a preferred embodiment, the histogram engine 710 can be configured to collect either the magnitude or the complex values or both. In a preferred embodiment, the histogram engine 710 can be configured to store the histogram in a memory at a specific location. This histogram may be optionally used in the processing of subsequent radar scan(s) to threshold the incoming radar data cubes.

Figure 8:
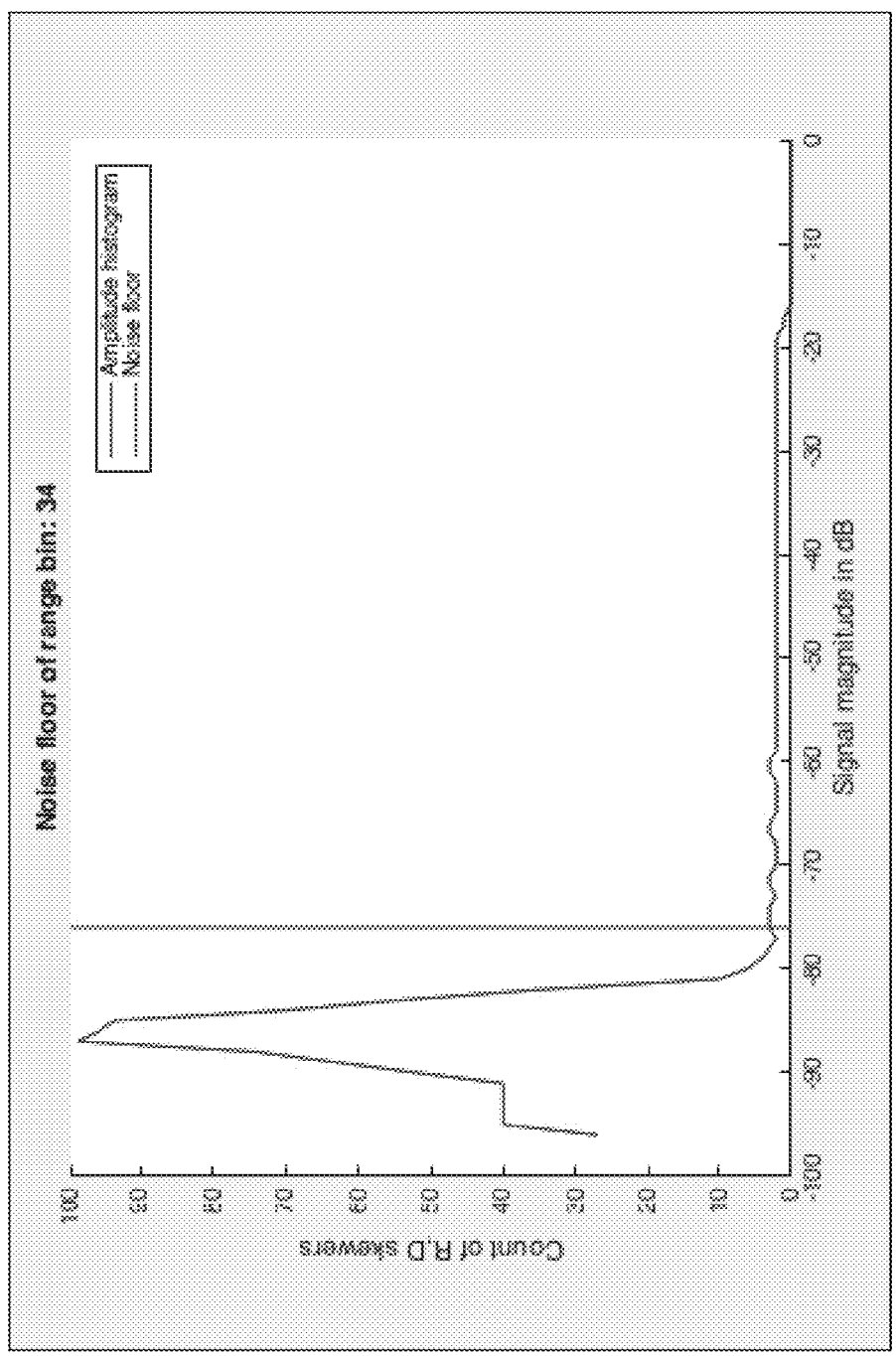
FIG. 8 is a plot illustrating an output of the histogram engine of FIG. 7, where the output is an estimate of a noise floor and is computed per range bin in accordance with the present invention.

The histogram of the power level is computed for each range bin computed across Doppler frequencies and angles and is used to estimate the noise floor. FIG. 8 illustrates an exemplary sample computed histogram and its application in estimating the noise floor. It is computed for a specific range bin, and captures the frequency count computed by the angle processor 602 across all parts of the RDC3 where both the range and the Doppler shift are constant, known as a skewer. A skewer is a set of memory locations in an RDC where two indexes are held constant but a third index varies. As used herein, the range bin and the Doppler/velocity are held constant, and one value per angle is taken to belong to the skewer which is processed to compute the histogram. The computed noise floor can be optionally used in thresholding subsequent frames. The noise floor can be determined, for example, by requiring the probability of the power level to be above the noise floor to be 0.0001.

Static Image Extraction:

In an exemplary radar system, such as in automotive radar, a large fraction of reflections received by the receivers may correspond to objects that are truly stationary, i.e., objects with near zero absolute velocity. In an automotive radar, the ground and objects along a road, such as lamp-posts and street signs, will all have zero absolute velocity. Any subsequent processing of the radar data cubes must store and analyze such objects.

Figure 7:
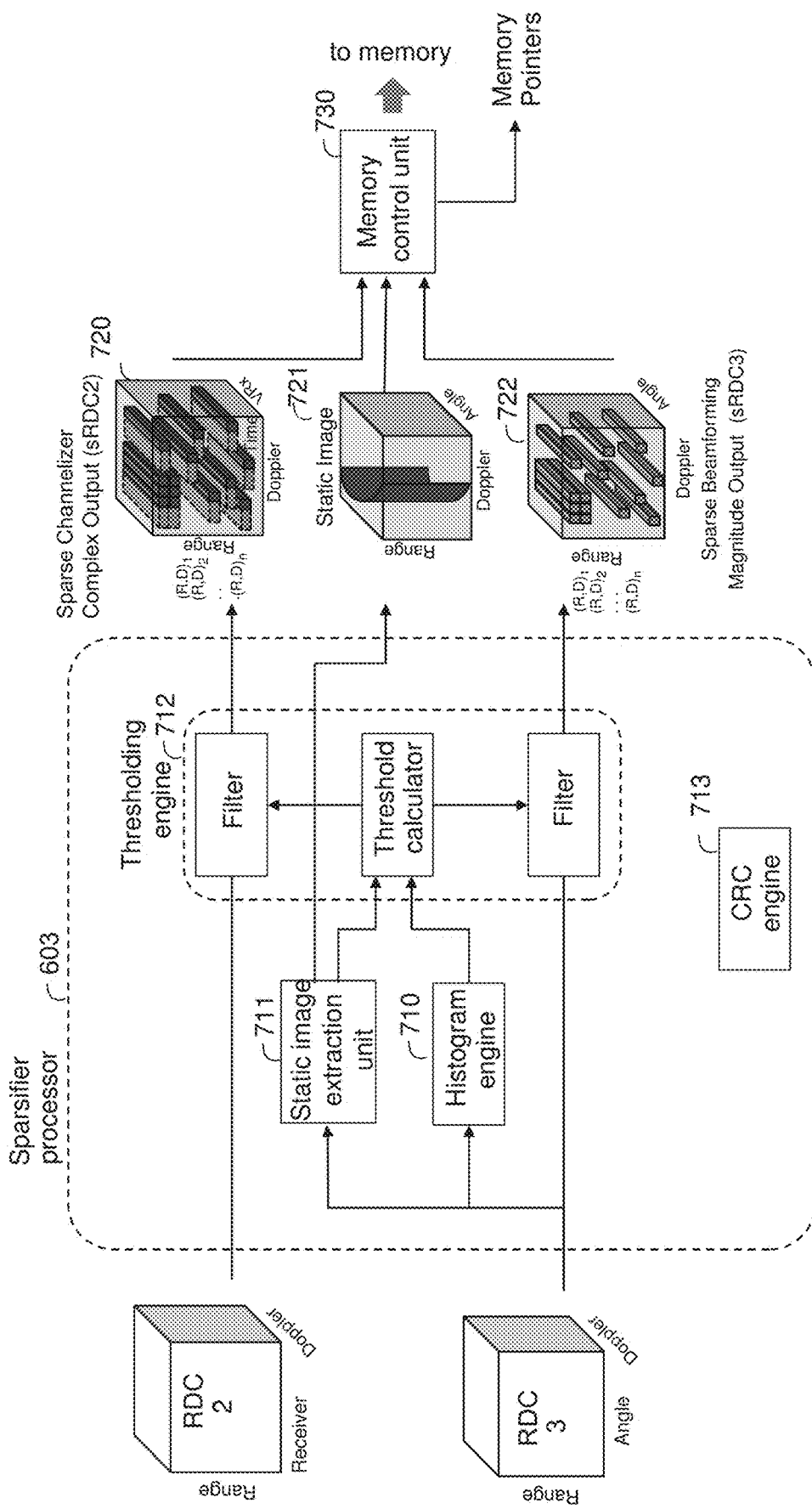
FIG. 7 is a block diagram illustrating the flow of information and outputs produced by the sparsifier processor of FIG. 6 in accordance with the present invention.
Figure 9:
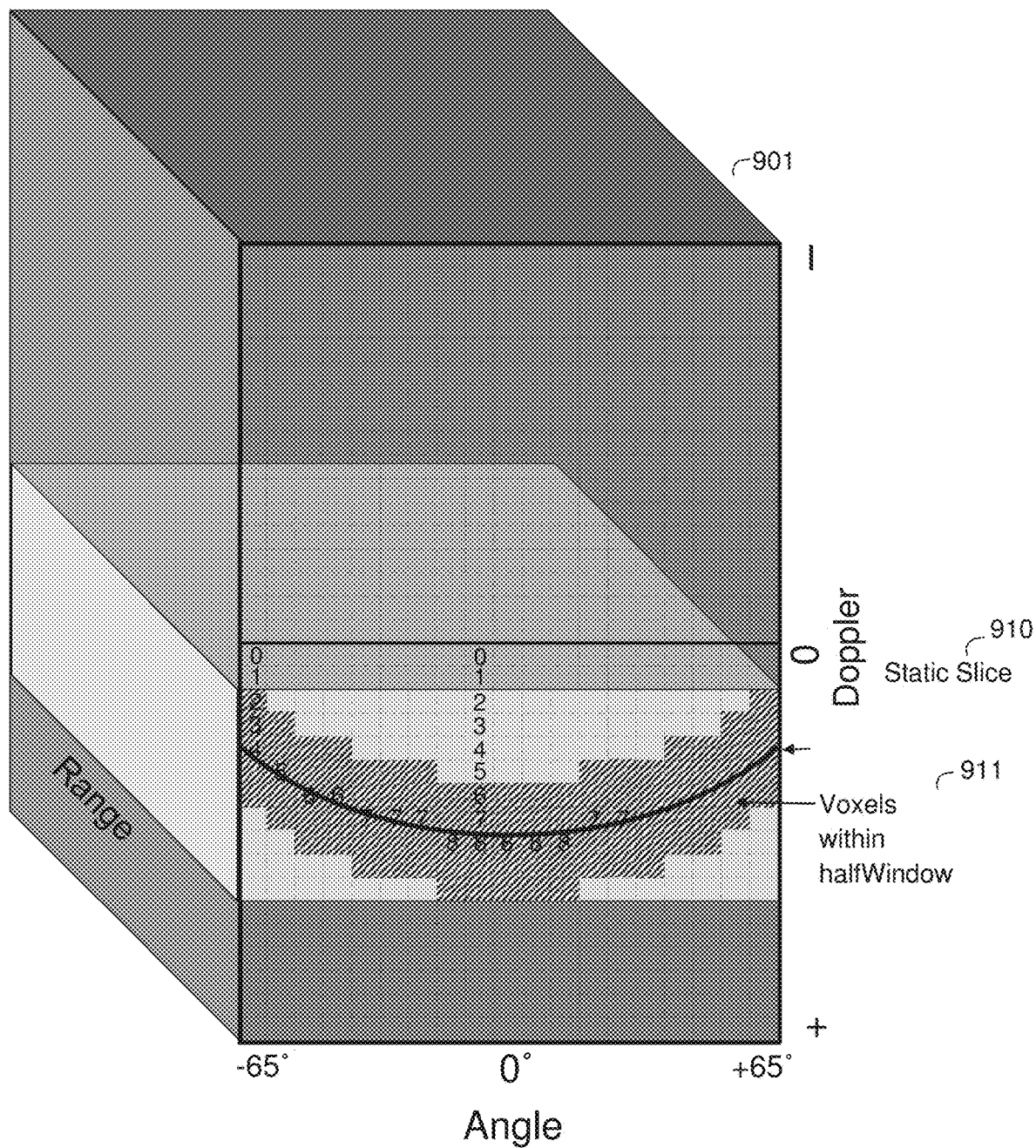
FIG. 9 is a portion of a radar data cube 3 illustrating the computation of a static slice and a window of voxels around it to output a static image in accordance with the present invention.
Figure 10:
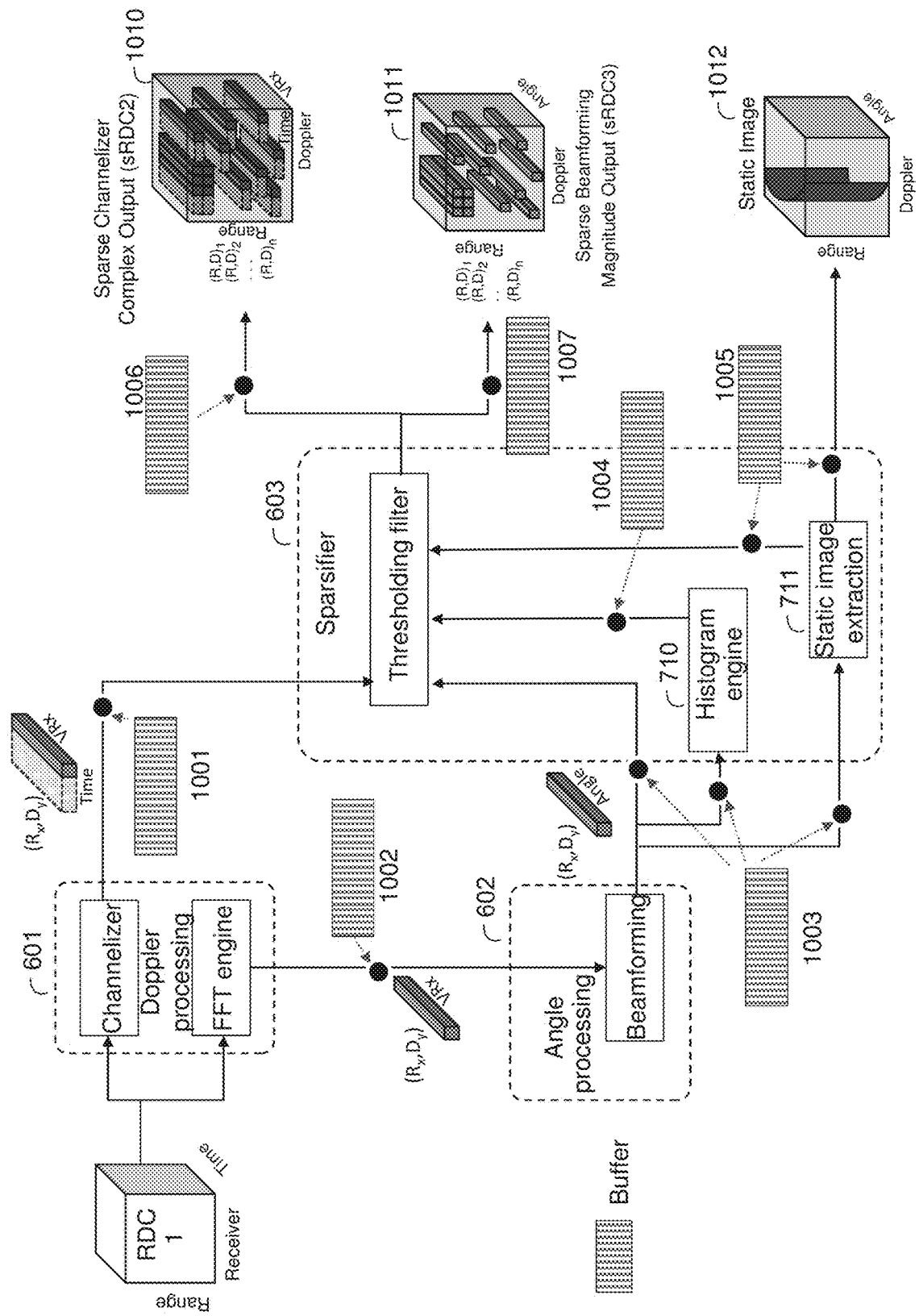
FIG. 10 is a block diagram illustrating the flow of information through a pipelined execution of receive computational modules with intermediate buffer storage in accordance with the present invention.

In one embodiment, illustrated in FIGS. 7, 9, and 10, a static image extraction unit 711 analyzes the RDC3 output of the angle processor 602 and tags voxels which correspond to a static image; that is, targets that are actually stationary. As used herein, a voxel refers to a three-dimensional data value. The static image extraction unit 711 tags all voxels that have near zero absolute velocity in the radial direction to the radar system, the so called "static image". This includes signals from all objects that are truly stationary, as well as from objects whose motion is entirely tangential to the radar.

For an automotive radar, if the equipped automobile is stationary, then the static image corresponds to all objects which have an identified Doppler-based velocity of 0 m/s, i.e., voxels in all range and angle bins corresponding to the slice of RDC3 where the Doppler axis is 0. In the case of a stationary automobile, all such voxels for Doppler bin 0 and for all identified range bins and angles can be output as the static image. If instead, the radar is mounted on a moving automobile moving at a speed $v_{automobile}$, then the Doppler values $v_{Doppler}$ as a function of the angle of objects (relative to bore sight or the direction of the automobile) in the static image are given by $$v_{Doppler} = v_{automobile} \times \cos(\text{angle})$$

In the above, the cosine of the angle of the object may be used to translate the relative velocity of the automobile in the direction of the object. For the case of a stationary automobile, the value of $v_{Doppler}$ for each angle is 0.

The static image extraction unit 711 identifies the voxels corresponding to stationary objects as the static image. In a preferred embodiment, a configurable parameter halfWindow is specified by a control processor, such that Doppler bins less than an absolute Doppler of halfWindow are chosen to belong to the static image. Specifically, a band of size fullWindow=2*halfWindow+1 is extracted centered around the computed $v_{Doppler}$ as discussed herein. Thereby, the static image extraction includes objects of 'near' zero absolute velocity where the threshold on the velocity is as specified in the halfWindow parameter.

FIG. 9 illustrates the tagging of the static image within the computed radar data cube 3 (901). The center of the static image as per the velocity formula is given by a single curve (910), and the choice of the neighboring voxels as per the halfWindow parameter is shown as shaded (911). The static image then consists of all shaded voxels and is saved for further processing. In the figure (FIG. 9), halfWindow is 3 and fullWindow is 5.

In one embodiment, to optimize the runtime processing, the static image extraction unit processing can be split into two modules. In a first module, a first static voxel satisfying the static image criterion for each angle slice can be computed using the velocity formula, along with the window size to be used. This may be stored in a small memory index table. Then in a second module, the memory index table can be read along with the window size to identify and tag voxels which belong to the static image.

Thresholding Engine:

In a preferred embodiment, a thresholding engine 712, as illustrated in FIG. 7, is used in the sparsifier processor 603 to filter all incoming voxels of the radar data cubes 2 and 3. Specifically, the thresholding engine 712 combines information collected by the static image extraction unit 711 and the histogram engine 710 to filter voxels of the two radar cubes. The thresholding engine 712 takes as input the radar data cubes 2 and 3 as output by the Doppler and angle processors (601, 602). For the radar cube 3, the thresholding engine 712 first checks if the incoming voxels have been tagged to be part of the static image by the static image extraction unit 711. If so, the thresholding engine 712 writes the corresponding complex values of those voxels of RDC3 to a "static image" (721). For all voxels not tagged by the static image extraction unit 711, the thresholding engine 712 applies the thresholding function. The threshold can be provided as a parameter to the thresholding engine 712 by software. In another embodiment, the threshold may be computed based on the histogram estimated per range bin for the previous radar scan as computed by the histogram engine 710. In this preferred embodiment, the thresholds for the different range bins could be different as estimated from the individual histograms.

Those voxels which satisfy the thresholding condition, i.e., are above the software specified threshold or above the noise floor computed in the previous radar scan, are stored in the memory. This applies to both the RDC2 and the RDC3 radar data cubes, generating their sparse versions denoted as sRDC2 and sRDC3 respectively. In a preferred embodiment, for RDC2, the thresholding engine 712 applies the thresholding function after a channelizer operation in the Doppler processor 601. The channelizer in 601 performs multiple FFTs on overlapping windows of a time series while the FFT in 601 performs an FFT over the whole time series. The channelizer output can be preferably used for super-resolution accelerated post-processing. Thus, sRDC2 (720) stores the sparse channelizer complex output on the axes of range, Doppler, and virtual receiver, while the sRDC3 (722) stores the sparse beamforming magnitude output with axes of range, Doppler, and angle.

DRAM Throughput Optimization in Storage of RDC1:

The output of the correlation processor 410 is stored as RDC1, with the three axes of time, range, and virtual receiver, with each value storing a complex number of preferably 32 bits, i.e., 16 bits each for the I and Q components. This output is generated per time sample for each range bin and virtual receiver. On the other hand, the Doppler processing unit 601 reads the information stored in RDC1 in a different order. For each range bin and virtual receiver, the Doppler processing unit 601 reads all the time samples, and then performs FFT operations across the time axis to generate velocity estimates.

Dynamic Random Access Memory (DRAM) is a commonly used technology to implement the storage of large blocks of data, such as the radar data cube RDC1. In an exemplary DRAM, each bit is stored in separate tiny capacitors with an integrated circuit, which are all arranged in a rectangular grid, called a bank, of rows and columns. To access (read or write) data, a DRAM bank is first charged, a row is activated, and a specific column or block of data is accessed. Given this access pattern, it is significantly faster to access all bits stored in a row than accessing bits across multiple rows. This performance aspect of the DRAM is combined with locality in memory access patterns to distribute data to maximize reading or writing bits from a row simultaneously.

If RDC1, as computed by the correlation processor 410, is stored in a DRAM and then read by a Doppler processing unit 601, there will be a mismatch in the reading and writing axes order. This can significantly reduce memory performance due to random access, i.e., by not utilizing the row access locality of DRAM. Specifically, the storage of logical addresses to physical locations in the memory can be optimized to benefit from locality in only one of the operations, either read or write. As an example, if an address assignment is such that writing by the correlation processor 410 leads to local accesses, then RDC1 will be laid out in memory by virtual receiver for a given range bin and time. Thus, writing to such a memory from the correlation processor 410 will have high locality and thus high performance. However, the reading operation by the Doppler processor 601 would read samples per time sample for a given range-bin and virtual receiver. Thus, reading operations would have random accesses with no locality, thereby resulting in very low DRAM performance (for the read operations).

In one embodiment, DRAM optimization may be achieved by ordering a writing of the RDC1 output to the DRAM and its subsequent processing by the Doppler processing unit 601 to maximize DRAM throughput. Specifically, RDC1 is written to memory with continuous virtual receivers as the inner loop for each range bin and time sample. That is, for a given first range bin and first time the writing is first done for various virtual receivers. The writing (of RDC1) will include high "burst locality" and thus high DRAM performance. Here burst locality refers to the property of the memory access pattern of reading sequentially—in a burst—multiple data items which are stored in consecutive locations in the DRAM. Such access patterns have high DRAM throughput because the DRAM module can read/write multiple consecutive locations simultaneously into its "row buffer." On the other hand, while reading data, the Doppler/velocity processing unit needs to read samples per time sample for a given range-bin and virtual receiver. This memory access pattern does not exhibit burst locality, as the data has been written to the DRAM to exhibit locality along the time axis. To modify this memory access pattern, RDC1 may be read by the Doppler processing unit 601 by prefetching data into a local buffer. Specifically, data from multiple virtual receivers are simultaneously pre-fetched to a local buffer. The number of virtual receivers to pre-fetch is such that a resultant burst length is long enough for high DRAM throughput, i.e., it reads data from all elements of the row buffer of the DRAM. With this modification to the memory access pattern, the underlying memory read/write requests by the Doppler/velocity processing unit to the DRAM, high throughput can be maintained both for write and read operations.

In one embodiment, the size of the buffer to be used at the input of the Doppler processing unit 601 is chosen based on the DRAM module's row size. As an example, in a case of 64 virtual receivers, the output of RDC1 will have complex values for 64 virtual receivers for each range bin and time. Of these, the samples for 8 virtual receivers can be pre-fetched in one memory read. Given that each sample in RDC1 has 32 bits of information, a total of 8×32=256 bits are to be read at a time, thereby achieving high DRAM throughput. The pre-fetching buffer should then allow the storage of multiple such pre-fetches for a given range-bin and for all possible time samples. Subsequently, the Doppler/velocity processing would apply FFT operations along the time axis for a given range-bin and virtual receiver.

In a further embodiment, the buffer of the Doppler processing unit 601 can be implemented in a shared memory. In such a setup, the amount of memory available for implementing this buffer can be increased or decreased. Correspondingly, the number of virtual receivers which are pre-fetched in one memory read can be dynamically adjusted based on the available memory.

On-the-Fly Block-Floating-Point Operation:

A block-floating-point (BFP) operation may emulate a floating point while using fixed point hardware. In such an exemplary operation, an entire block of data is assigned a common exponent. Thereby, the necessity of saving individual floating points values is avoided. This creates the potential to optimize the bit-width of different parts of a compute pipeline, e.g. a FFT processing pipeline. Thus, BFP operation is a trade-off between fixed-point and full floating-point architecture.

For a given block of data, a common exponent is found as a data item with a largest amplitude in the block, i.e., the maximum number of leading bits across all data items of the block. In other words, the number of left shifts needed for the data to be normalized to the dynamic range of the hardware is used as the common exponent.

Consider an exemplary FFT operation that is performed with BFP operations. Unlike a true floating-point operation, a BFP FFT block does not provide exponents for individual data items. A complex value integer pair may be represented with one scale factor that is shared through the block among other complex value integer pairs. After every FFT stage, the largest output value is detected and the result is scaled to improve the precision. The number of left or right shifts to be performed in the scaling is recorded in the common exponent.

Specifically, for the receive pipeline, as illustrated in FIG. 6, the output of the correlation processor 410 generates the radar data cube 1 (RDC1) which is read by the Doppler processor 601. However, given the memory size of RDC1, practical bounds on memory and bit-width prevent operating on such large amounts of data. For example, a single scan may preferably have correlator data from 256 virtual receivers for 512 range bins and over 1024 time slices. As each complex number requires 4 bytes of storage, the total storage requirement for a radar data cube RDC1 for a single scan is 512 MB. Thus, methods are required to more compactly represent the output of RDC1. One exemplary method is to use block-floating-point operations.

As discussed herein, BFP operations require identifying a common exponent for all data. This operation is also prohibitive as it requires storing and analyzing the entire block. To avoid this, one embodiment may employ an on-the-fly BFP operation, wherein the conversion to the block exponent happens on-the-fly while reading each sample of RDC1 computed by the correlation operation. In other words, as each sample is read from the RDC1, it is transformed into BFP notation using a local computation. However, different samples may require different adjustments, i.e. left or right shifts, with respect to the common exponent. Such adjustments are written to a table which records which samples must be adjusted and by how many bits. While reading these samples, this table is referred to in order to adjust each sample by the right number of bits.

In one embodiment, the real component of the 512 time samples, computed after correlating the received and delayed transmitted signals, are stored in a skewer of RDC1, with each data point provided as a 24-bit value. Similarly for the imaginary component. These samples are to be stored as 16-bit values in the memory with a block exponent. As discussed herein, the block exponent cannot be computed by first reading all values, but can only be computed on-the-fly. The samples are read in a time sequence. A first sample is read, and a number of leading zeros in the number is identified as being one less than a number of repeating sign bits. For example, if 0 repeats 5 times in this first sample, it indicates 4 leading zeros in the number. This number, i.e. 4, is recorded as the first block exponent value. This recording is done in a separate table called the exponent normalization table. The first sample is then adjusted as per the block exponent value, i.e., the value is left-shifted by 4 bits and optimized to be sent as a 16-bit value, by dropping all less significant bits that do not fit. Then the next sample value in sequence is read. If the absolute value is less than that of the first sample value, i.e. if it has equal or more leading zeros, then the same block exponent is used and the number is left-shifted by the same number of bits, which is 4 bits in the given example. Similarly, as long as sample values have fewer leading zeros, the same block exponent is used and the number is left-shifted by the same number of bits, which is 4 bits in the given example.

However, any sample value which has fewer leading zeros, i.e., whose absolute value is higher than that of the previous value at which the block exponent was calculated, two things are done. First, the number of leading zeros in the current number is calculated, and then an entry is made in the exponent normalization table. For example, if the $102^{nd}$ sample has only 3 leading zeros, then the exponent normalization table notes that the block exponent is changed to 3. This process is continued through all samples, which is 512 in this example. In a further example, if the 255th value has only 2 leading zeros, then the exponent normalization table notes the index 255 and the corresponding change in the block exponent. Let all subsequent samples have 2 or more leading zeros. Then, the generated exponent normalization table looks like:

| Sample index | Block exponent |
| --- | --- |
| 0 | −4 |
| 102 | −3 |
| 255 | −2 |

Total adjustments: 2

Applying the above described on-the-fly block floating operation, the output of the RDC1 is realized as 16-bit values of samples stored in the memory, and in addition an exponent normalization table like the one illustrated above. Because the bit-width is reducing from 24 to 16 bits, there can be at most 8 adjustments made in the exponent normalization table, which will record the corresponding index values where the adjustments happen. As illustrated above, the exponent normalization table also includes an entry for the total number of adjustments.

The Doppler processing unit 601 reads the stored 16-bit values along with the exponent table. These values are to be parsed with the exponent normalization table by making appropriate adjustments. First, the exponent normalization table is read to identify the maximum exponent. In the example above, the maximum exponent is −2, as the sample at index 255 had that as the block exponent. This value is set as the common exponent for this entire block. However, all values which were left-shifted by a greater number of bits than the maximum exponent will need to be right-shifted by the appropriate number of bits. This may be done by sequentially traversing the exponent normalization table and adjusting the number of bit shifts to be performed. In the example considered, the following operations are performed:
Samples 0-101: shift incoming values by 2 bits to the right.
Samples 102-254: shift incoming values by 1 bit to the right.
Samples 255-511: no changes required.

After the above processing, the Doppler processing unit 601 will receive a stream of numbers with a single common exponent. This on-the-fly computation of block exponent and subsequent adjustment can be done in a pipelined manner with intermediate buffer storage.

In one embodiment, different parts of the RDC1 are treated as separate blocks with multiple exponent-adjustment tables marking the transitions in the adjustments to be made. RDC1 data may be read on a per range-bin or virtual receiver basis to convert time-samples into Doppler samples. In one embodiment, a different block exponent could be assigned to each range-bin, and thus there are as many adjustment tables as there are range-bins.

Pipelined Implementation:

In one exemplary embodiment, to meet high throughput design constraints while limiting memory and transfer constraints, different modules of the receive pipeline may be configured to execute concurrently interfaced with buffers which can be read from and written to simultaneously. Specifically, all the following operations can be pipelined: (a) estimating range by correlating received signals with delayed copies of transmitted signals, (b) estimating velocity with Doppler FFT operations, (c) estimating angles with rough beamforming algorithms, (d) channelizing to trade-off Doppler resolution for multiple looks used in super-resolution angle estimation, (e) extracting a static image slice from the output of the angle processing, and (f) sparsifying the RDC2 and RDC3 radar data cubes based on the static image and noise floor estimates. Between the different modules that execute these operations, intermediate buffers may be used to store partial results to enable concurrent processing.

Specifically, the radar data cubes RDC2 and RDC3 can be stored in first-in, first-out (FIFO) buffers where all the information associated with a particular scan (e.g., range, Doppler, and virtual receiver) are not necessarily stored simultaneously but are being written into the FIFO while other information is being read out. Thus, while the Doppler and angle processors (601, 602) write parts of the RDC2 and RDC3 to the buffers, the histogram engine 710 and thresholding engine 712 can read other parts of the cubes. As the information passes through the FIFO buffers, the static image extraction unit 711 tags voxels which belong to the static image. For each particular untagged voxel sample in the RDC3, the sparsifier (603) compares the magnitude of the sample to one or more thresholds configured by the control processor. Depending on the outcome of the comparison, a set of samples, including the sample, are stored in one or more distinct memory buffers. Preferably, the set of samples comprise samples with a same range or Doppler/velocity as a particular voxel sample. The outputs—including the static image and the sparsified cubes sRDC2 and sRDC3—can also be written to FIFO buffers.

FIG. 10 illustrates an exemplary pipelined implementation. The buffers 1001 and 1002 store the output of the Doppler processing unit 601 in skewers for all virtual receivers for a given range bin and Doppler/velocity. The output of the channelizer stores multiple such skewers obtained by FFT operations on multiple windows for subsequent super-resolution angle processing. Meanwhile, the buffer 1003 stores the output of angle processing, again as skewers, for all angles for a given range bin and Doppler/velocity. The sparsifier unit 603 reads values from these buffers to (a) compute the histogram for noise estimation, (b) compute the static image slice, and (c) tag voxels which correspond to either the static image or exceed in amplitude the estimated noise floor. This exemplary processing happens on the fly and the output is written into different buffers. Buffer 1006 stores the sparsified RDC2 or sRDC2 cube in the format illustrated in the data format 1010, buffer 1007 stores the sparsified RDC3 or sRDC3 in the format illustrated in the data format 1011, and buffer 1005 stores the static image slice in the format illustrated in the data format 1012.

With buffers between computing modules, the execution of these modules may be pipelined, thereby increasing the throughput. Further, as data is processed on-the-fly, there are reduced storage requirements. However, optimization is necessary to size the buffers depending on the throughput of the individual modules and the sizes of the outputs from the respective processing modules. Dataflow analysis may be performed to estimate the sizes of each of the buffers to avoid stalling any of the modules. In a preferred embodiment, the buffers could be stored in a shared memory where their sizes can be dynamically changed at runtime by passing through appropriate pointers across the pipeline.

Functional Correctness:

Functional safety is an important aspect of automotive devices. It would be advantageous if an exemplary radar device as part of an automotive system was able to self-diagnose any potential issues, however, rare. This applies to different parts of the radar system, including the receive pipeline (401) illustrated in FIG. 10. Specifically, memory arrays are particularly susceptible to errors, in which data bits stored in memory can be flipped by, for example, alpha particles or cosmic rays. Thus, the different outputs of the receive pipeline namely RDC2 and RDC3, and the static image slice, need to be verified for correctness. Error-detecting and error-correcting codes can be used to increase system reliability. Memory errors can be detected or even corrected by adding extra check bits to each stored word.

In one embodiment, a CRC engine 713, illustrated in FIG. 7 can be used to compute a cyclic redundancy check (CRC) on the data-set. The CRC check may be configured to be computed either before or after the sparsification of the radar data cubes 2 and 3. The CRC is an error-detecting code that can detect unintended changes in raw data. An exemplary CRC engine adds parity checks: bits/bytes based upon a remainder found from dividing the data mapped into a polynomial with a known code generator polynomial. At the time of the verification, this division is repeated. In the event the check values do not match, corrective action can be taken against data corruption. Specifically, if the radar scan is completed and the computed CRC values do not match, then an interrupt can be generated which can be used to trigger a software-based corrective action.

In one embodiment, the CRC engine 713 could be upgraded to an exemplary error correction code (ECC) engine that can be used to compute parity checks for an error correcting code, also called a forward error correction code. The parity checks can be used to correct errors. More parity checks will allow for the correction of more bits. ECC codes can also do a combination of error correction and error detection. Codes capable of single error correcting and double error detecting are known as SEC-DED codes. Error-correcting codes append check bits to every data word to increase the minimum Hamming distance between different valid words. Here, the Hamming distance between any two binary numbers is the number of bits at which the two numbers differ. Adding a single parity check bit, which causes the minimum Hamming distance of 2 between valid codewords, may be used to detect single bit errors. Multiple check bits can be added to increase the Hamming distance to 3 to correct single bit errors. For a Hamming distance of 4, a single-bit error can be corrected, and a two-bit error can be detected, though not corrected. ECC can be implemented using Hamming codes which is a family of perfect linear block codes, and other codes including BCH codes and Reed-Solomon codes. Like the CRC engine (713), an exemplary ECC could be applied to the RDC1, RDC2 cubes and the static image slices, either before or after the sparsification. When these memory blocks are read for subsequent processing, when using an SEC-DED code, single bit errors can be corrected and double errors detected. Further, if two bit errors are detected, then an interrupt can be generated which can be used to trigger a software-based corrective action.

Memory Interface:

An exemplary memory interface or control unit 730, illustrated in FIG. 7, interfaces the output of the thresholding engine 712, i.e., the static slice, sRDC2, and sRDC3, to a memory unit. The memory pointers for storing these data sets could be provided to the memory interface unit 730 as an input. For each pointer, the maximum available space can also be provided as an input to check if there is enough space to store the data. For any pointer, if the available space is fully used, and more data needs to be used, the memory interface unit 730 can assert an interrupt and optionally drop all subsequent data to that pointer. In another embodiment, for each pointer an additional lower threshold is configured, such that if the used space for that pointer exceeds the lower threshold, then data stored to that pointer can be limited by other explicit methods.

Optionally, the memory interface unit 730 can store other data structures to the memory, as configured by parameters set by a control processor. These additional data structures can include the histogram used to estimate the noise floor and the bit map of angles where the signal amplitude was above the configured noise floor threshold.

Changes and modifications in the specifically described embodiments can be carried out without departing from the principles of the present invention which is intended to be limited only by the scope of the appended claims, as interpreted according to the principles of patent law including the doctrine of equivalents.

The invention claimed is:

1. A radar sensing system for a vehicle, the radar sensing system comprising:
    a transmit pipeline comprising a plurality of transmitters configured for installation and use on a vehicle and configured to transmit radio signals;
    a receive pipeline comprising a plurality of receivers configured for installation and use on the vehicle and configured to receive radio signals that include the transmitted radio signals transmitted by the transmitters and reflected from objects in an environment;
    a sparsifier processor; and
    a memory;
    wherein the receive pipeline is configured to correlate the received radio signals of the plurality of receivers with a plurality of time-delayed replicas of the transmitted radio signals to produce samples stored in the memory as a first three-dimensional radar data cube (RDC) corresponding to three dimensions including in one dimension ranges of different objects in the environment as measured by different receivers;

wherein the receive pipeline is configured to process the first RDC to estimate Doppler/velocity of objects in the environment for given ranges and given receivers to produce a second RDC corresponding to three dimensions including in one dimension Doppler/velocity estimates of the different objects as defined by their corresponding given ranges for the given receivers from the first RDC;

wherein the receive pipeline is configured to process the second RDC to estimate angles of objects in the environment for given ranges and Doppler/velocity estimates to produce a third RDC corresponding to three dimensions including in one dimension angle estimates of the different objects as defined by their corresponding Doppler/velocity estimates and given ranges from the second RDC;

wherein the receive pipeline is configured to output the second RDC and the third RDC to the sparsifier processor; and wherein the sparsifier processor is configured to analyze the second RDC and the third RDC to compute sparse versions of the second RDC and the third RDC, wherein the sparse versions comprise selected regions of interest in the second RDC and third RDC, wherein samples within the selected regions of interest have similar Doppler estimates, range and/or angle, and wherein the sparse versions of the second RDC and the third RDC are stored in the memory for further processing.

2. The radar sensing system of claim 1, wherein the receive pipeline is configured to process the first RDC to estimate Doppler of objects in the environment for given ranges and for given receivers.

3. The radar sensing system of claim 1, wherein the receive pipeline is configured to process the second RDC to estimate angles of objects in the environment for given ranges and for given Doppler shifts.

4. The radar sensing system of claim 1, wherein the sparsifier processor is configured to analyze the third RDC to: (i) identify voxels of interest corresponding to targets of low absolute velocity by identifying those voxels with Doppler/velocity estimates below a threshold, (ii) tag or identify a plurality of regions, including the identified voxels of interest, as belonging to a static image, and (iii) marking the identified voxels of interest as belonging to the static image.

5. The radar sensing system of claim 4, wherein the sparsifier processor is configured to output the static image to an external memory by specifying a first static voxel to be captured for each angle slice, along with a window width to be captured.

6. The radar sensing system of claim 5, wherein the sparsifier processor is configured to identify regions of interest by applying a thresholding condition to be applied to filter each voxel of the second RDC and the third RDC, apart from those regions already tagged.

7. The radar sensing system of claim 6, wherein the thresholding condition is based on one of (i) a threshold specified in software and (ii) a threshold computed with operations on the third RDC.

8. The radar sensing system of claim 7, wherein the computed threshold is based on histograms per range bin of different angles.

9. The radar sensing system of claim 1, wherein the sparsifier processor is configured to compute parity checks on data either before or after the sparsification operations, and wherein the sparsifier processor is configured to compute parity checks by checking bit/byte values based upon a remainder found from dividing data mapped into a polynomial with a known code generator polynomial.

10. A method for optimizing memory performance and access of a radar data cube (RDC) in a receive pipeline of a radar sensing system for a vehicle, the method comprising:

transmitting, with a plurality of transmitters, radio signals;

receiving, with a plurality of receivers, radio signals that include the transmitted radio signals transmitted by the transmitters and reflected from objects in an environment;

correlating the received radio signals of the plurality of receivers with a plurality of time-delayed replicas of the transmitted radio signals to produce samples stored in a memory as a first three-dimensional radar data cube (RDC) corresponding to three dimensions including in one dimension ranges of different objects in the environment as measured by different receivers;

processing the first RDC to estimate Doppler shifts at given ranges and for given receivers to produce a second RDC corresponding to three dimensions including in one dimension Doppler/velocity estimates of the different objects as defined by their corresponding given ranges and given receivers from the first RDC;

outputting the first RDC from a correlation processor to a dynamic random access memory (DRAM) arranged by receivers in an inner loop, followed by range-bin and time;

inputting the first RDC from the DRAM to a Doppler processor by means of prefetching to a local buffer; and maximizing DRAM read performance by preserving access to data from multiple receivers.

11. The method of claim 10, wherein a quantity of receivers that are pre-fetched to the local buffer is dependent upon an available row size of the DRAM, such that burst access maximizes received throughput.

12. The method of claim 10, wherein a quantity of receivers that is pre-fetched is changed as defined by an available buffer size at an input of the Doppler processing engine.

13. The method of claim 10, wherein outputting the first RDC to the DRAM by receivers in an inner loop comprises outputting the first RDC to the DRAM with continuous receivers as an inner loop for each range bin and time sample, such that for a given range bin, the writing is first performed for the receivers.

14. The method of claim 10, wherein preserving access to data from multiple receivers comprises providing burst locality for the multiple receivers, such that the data is read sequentially in consecutive locations in the DRAM.

15. A method for optimizing memory performance and access of a radar data cube (RDC) in a receive pipeline of a radar sensing system for a vehicle, the method comprising:

transmitting, with a plurality of transmitters, radio signals;

receiving, with a plurality of receivers, radio signals that include the transmitted radio signals transmitted by the transmitters and reflected from objects in an environment;

correlating the received radio signals of the plurality of receivers with a plurality of time-delayed replicas of the transmitted radio signals to produce samples stored in a memory as a first three-dimensional radar data cube (RDC) corresponding to three dimensions including in one dimension ranges of different objects in the environment as measured by different receivers;

processing the first RDC to estimate Doppler, at given ranges and for given receivers to produce a second RDC corresponding to three dimensions including in one dimension Doppler/velocity estimates of the different objects as defined by their corresponding given ranges and given receivers from the first RDC;

computing one or more common block exponents for the first RDC to reduce a bit-width required to represent complex numbers in samples of the first RDC.

16. The method of claim 15, wherein the one or more common block exponents are computed on-the-fly without analyzing all samples in the block, and wherein the one or more common block exponents are computed on-the-fly by computing each sample from the first RDC as those respective samples are read from the first RDC.

17. The method of claim 16, wherein the common block exponent computations output a table that specifies a number of bits by which different complex samples are left or right shifted.

18. The method of claim 17, wherein the table output by the block component computation block is read to adjust the samples while reading them for subsequent processing, and wherein each sample is adjusted after being read.

19. The method of claim 15, wherein computing the block exponent is performed for multiple blocks of the first RDC.

20. The method of claim 15, wherein samples associated with each range-bin are chosen as separate blocks.

\* \* \* \* \*